(12) United States Patent
Shoji et al.

(10) Patent No.: US 10,074,690 B2
(45) Date of Patent: Sep. 11, 2018

(54) SEMICONDUCTOR DEVICE AND METHOD OF MANUFACTURING THE SAME

(71) Applicant: Sony Corporation, Tokyo (JP)

(72) Inventors: Mitsuharu Shoji, Kanagawa (JP); Ichiro Fujiwara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/290,127

(22) Filed: Oct. 11, 2016

(65) Prior Publication Data

US 2017/0033157 A1 Feb. 2, 2017

Related U.S. Application Data

(62) Division of application No. 14/282,009, filed on May 20, 2014, now Pat. No. 9,502,467.

(30) Foreign Application Priority Data

May 22, 2013 (JP) ................. 2013-108448

(51) Int. Cl.
| | | |
|---|---|---|
| H01L 29/82 | (2006.01) |
| H01L 43/00 | (2006.01) |
| H01L 27/22 | (2006.01) |
| H01L 43/12 | (2006.01) |
| H01L 27/24 | (2006.01) |
| H01L 43/02 | (2006.01) |
| H01L 43/10 | (2006.01) |

(52) U.S. Cl.
CPC ........ *H01L 27/228* (2013.01); *H01L 27/2436* (2013.01); *H01L 43/02* (2013.01); *H01L 43/10* (2013.01); *H01L 43/12* (2013.01)

(58) Field of Classification Search
CPC ... H01L 27/228; H01L 27/2436; H01L 43/02; H01L 43/10; H01L 43/12
USPC ....................................... 257/421
See application file for complete search history.

(56) References Cited

U.S. PATENT DOCUMENTS

| | | |
|---|---|---|
| 2007/0206403 A1 | 9/2007 | Shirahama et al. |
| 2010/0181547 A1 | 7/2010 | Kuroda |
| 2013/0037862 A1 | 2/2013 | Kitagawa et al. |

FOREIGN PATENT DOCUMENTS

JP 2010-171166 8/2010

*Primary Examiner* — Thien F Tran
(74) *Attorney, Agent, or Firm* — Dentons US LLP

(57) ABSTRACT

A semiconductor device including: a first member including a selection transistor on a front surface side of a first substrate; and a second member including a resistance change device and a connection layer that comes in contact with the resistance change device, the connection layer being bonded to a back surface of the first member.

8 Claims, 37 Drawing Sheets

STT-MTJ (PERPENDICULAR MAGNETIZATION TYPE)

STT-MTJ (IN-PLANE MAGNETIZATION TYPE)

SEMICONDUCTOR DEVICE AND METHOD OF MANUFACTURING THE SAME

CROSS REFERENCE TO RELATED APPLICATION

This application is a divisional of U.S. patent application Ser. No. 14/282,009 filed May 20, 2014, the entirety of which is incorporated herein by reference to the extent permitted by law. This application claims the benefit of Japanese Priority Patent Application JP 2013-108448 filed May 22, 2013, the entire contents of which are incorporated herein by reference.

BACKGROUND

The present disclosure relates to a semiconductor device that includes a resistance change device and a selection transistor and a method of manufacturing the same.

As a nonvolatile memory in which information is not lost even when a power source thereof is turned off, an MRAM (Magnetoresistive Random Access Memory) (a magnetoresistive memory), a ReRAM (Resistive Random Access Memory) (a resistance change type memory), and so forth are well known. In addition, a memory device in which a memory layer formed by laminating an ion source layer and a resistance change layer is included between two electrodes and information is written by utilizing a change (a change in resistance) in electrical characteristics of the resistance change layer is also proposed. All of these memory devices are adapted to store information through a change in resistance state and will be generally referred to as a "resistance change device" in the present specification.

In general, after a selection transistor and a multilayer wiring are formed on a silicon (Si) substrate, the resistance changing device is formed on its upper layer. However, nowadays, it is being attempted to arrange the resistance change device on a back surface side of the substrate. For example, Japanese Unexamined Patent Application Publication No. 2010-171166 (see FIG. 6, FIG. 7, and so forth) describes a configuration in which a transistor is formed on a front surface side of a substrate and a resistance change device is arranged on a back surface side of the same substrate.

SUMMARY

It has been desired to improve the characteristics of the resistance change device also when the resistance change device is arranged on the back surface side of the substrate in such a way.

It is desirable to provide a semiconductor device that makes it possible to improve the characteristics of a resistance change device and a method of manufacturing the same.

According to an embodiment of the present disclosure, there is provided a semiconductor device including: a first member including a selection transistor on a front surface side of a first substrate; and a second member including a resistance change device and a connection layer that comes in contact with the resistance change device, the connection layer being bonded to a back surface of the first member.

In the semiconductor device according to the embodiment of the present disclosure, since the resistance change device and the connection layer are provided in the second member that is different from the first member having the selection transistor, the resistance change device is formed on a surface that has no level difference caused by a lower layer structure and is high in smoothness and therefore the characteristics of the resistance change device are improved.

According to an embodiment of the present disclosure, there is provided a method of manufacturing a semiconductor device. The method includes: forming a second member that includes a resistance change device and a connection layer that comes in contact with the resistance change device; and bonding the connection layer to a back surface of a first member that includes a selection transistor on a front surface side of a first substrate.

According to the semiconductor device according to the embodiment of the present disclosure or the method of manufacturing the semiconductor device according to the embodiment of the present disclosure, since the resistance change device and the connection layer are provided in the second member that is different from the first member having the selection transistor and the connection layer is bonded to the back surface of the first member, it is possible to improve the characteristics of the resistance change device.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, embodiments of the present disclosure will be described in detail with reference to the accompanying drawings. It is to be noted that description will be made in the following order.
1. First Embodiment (a semiconductor device: an example of an in-plane magnetization type STT-MTJ)
2. Second Embodiment (a semiconductor device: an example of the in-plane magnetization type STT-MTJ in which a common laminated section is used as a bit line without processing a tunnel barrier layer)
3. Third Embodiment (a semiconductor device: an example of the in-plane magnetization type STT-MTJ in which a bit line is provided separately from the common laminated section)
4. Fourth Embodiment (a semiconductor device: an example in which a memory device section and a logic device section are laminated)
5. Fifth Embodiment (a semiconductor device: an example of a perpendicular magnetization type STT-MTJ)
6. Sixth Embodiment (a semiconductor device: an example of the perpendicular magnetization type STT-MTJ in which a side wall is formed on a side surface of a discrete laminated section and a bit line is provided separately from a common laminated section)
7. Seventh Embodiment (a semiconductor device: an example of a ReRAM)
8. Eighth Embodiment (a semiconductor device: an example that includes a memory layer formed by laminating an ion source layer and a resistance change layer)
9. Modification Example 1 (a semiconductor device: an example in which a degree of integration is increased by providing a resistance change device also in a first member)

10. Modification Example 2 (a semiconductor device: an example in which the memory device section and the logic device section are disposed on a front and a back of one substrate)

First Embodiment

Figure 1:
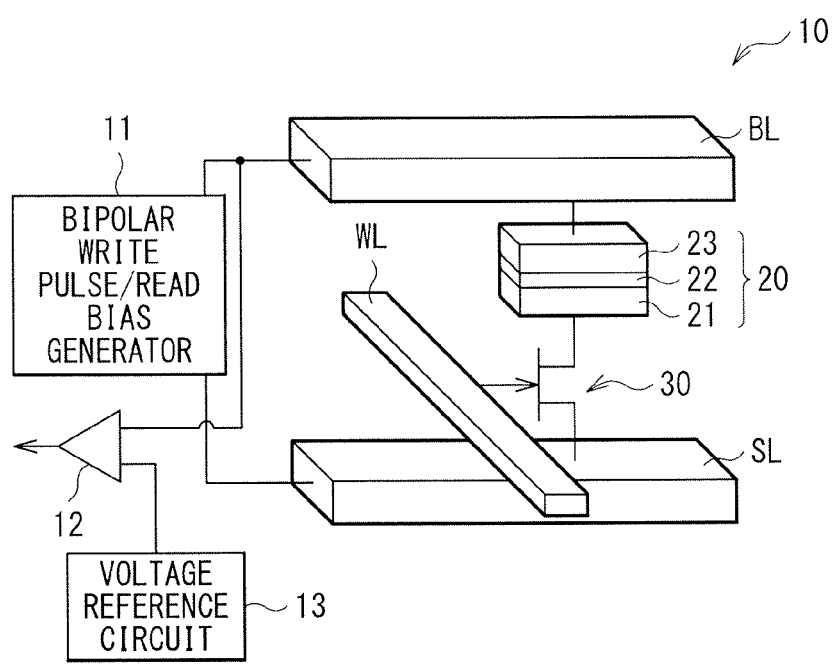
FIG. 1 is a diagram schematically illustrating a configuration of one memory cell in a semiconductor device according to a first embodiment of the present disclosure.
Figure 2:
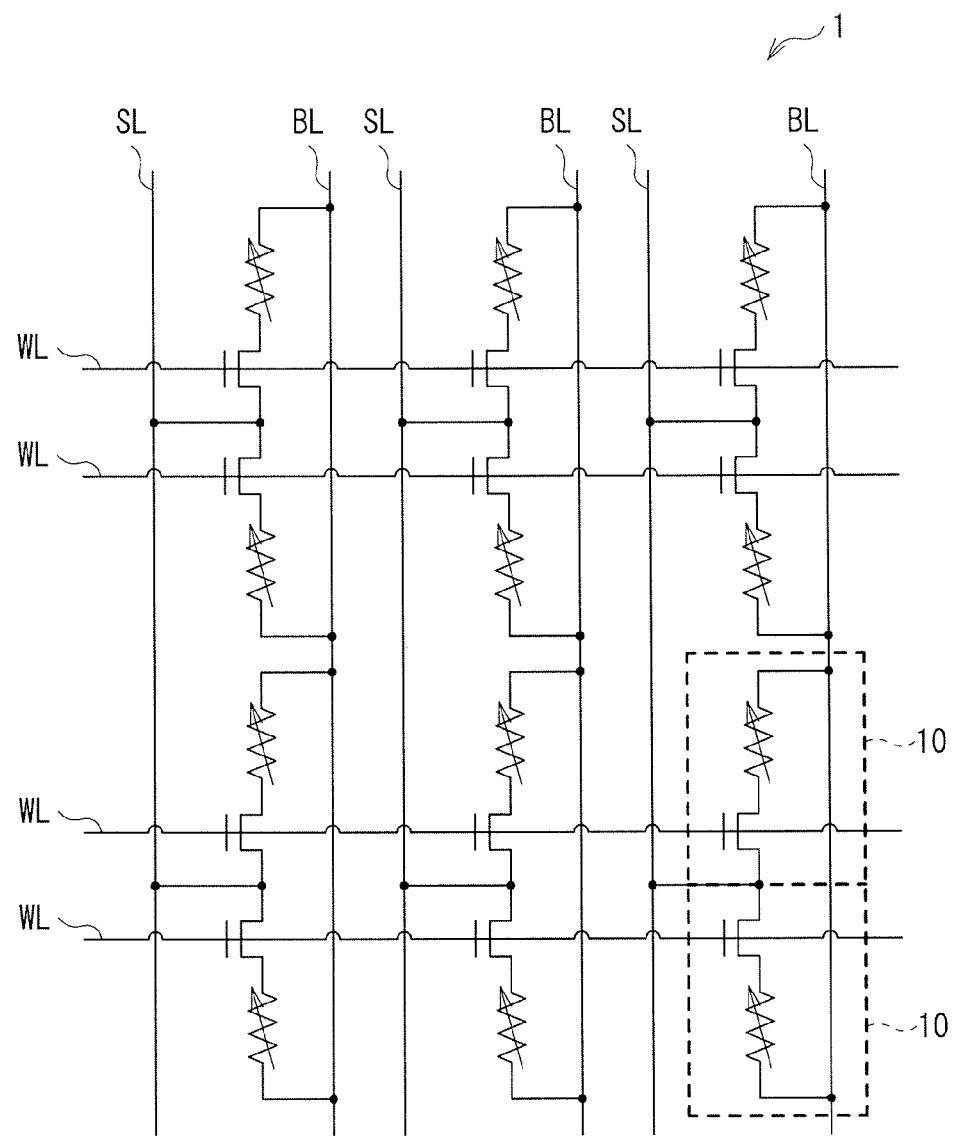
FIG. 2 is a circuit diagram illustrating a general configuration of the semiconductor device according to the first embodiment of the present disclosure.

FIG. 1 and FIG. 2 are diagrams each illustrating a configuration of a semiconductor device 1 according to a first embodiment of the present disclosure. The semiconductor device 1 is of a type in which a plurality of memory cells 10 illustrated in FIG. 1 are arranged in a matrix as illustrated in FIG. 2 to configure a memory cell array (a memory device).

The memory cell 10 includes one resistance change device 20 and one selection transistor 30 as illustrated in FIG. 1.

It is preferable that the resistance change device 20 be a spin injection magnetization reversal type memory device (STT-MTJ: Spin Transfer Torque-Magnetic Tunnel Junctions) that may include, for example, a record layer 21, a tunnel barrier layer 22, and a reference layer 23.

In a typical structural example of the in-plane magnetization type device, the reference layer 23 has a laminated structure configured of an antiferromagnetic material made of PtMn, IrMn, and so forth, and a single layer of CoFe, CoFeB, and so forth or a laminated fern-structure of CoFe/Ru/CoFeB and so forth. The tunnel barrier layer 22 may be configured of an oxide film made of, for example, AlO, MgO, and so forth. The record layer 21 may be configured of, for example, a single layer of CoFe, CoFeB, NiFe, and so forth or a laminated structure in which a layer of Ru, MgO, and so forth is sandwiched between layers of CoFe, CoFeB, NiFe, and so forth.

Figure 3:
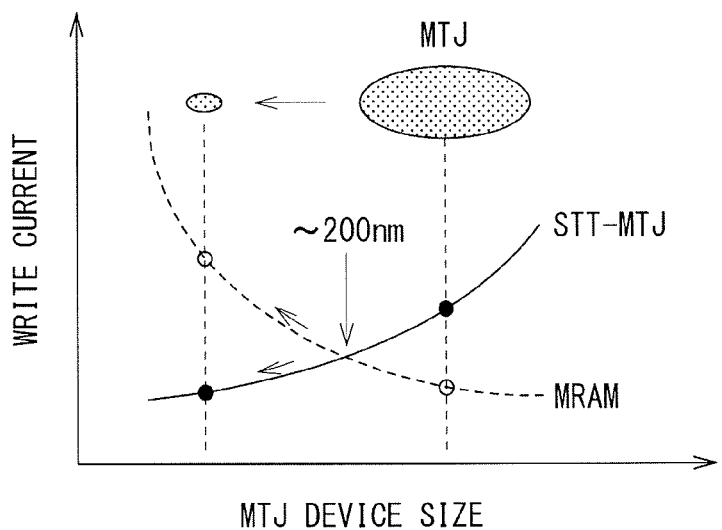
FIG. 3 is a diagram for explaining a relation between a device size of a resistance change device illustrated in FIG. 1 and a write current.
Figure 4:
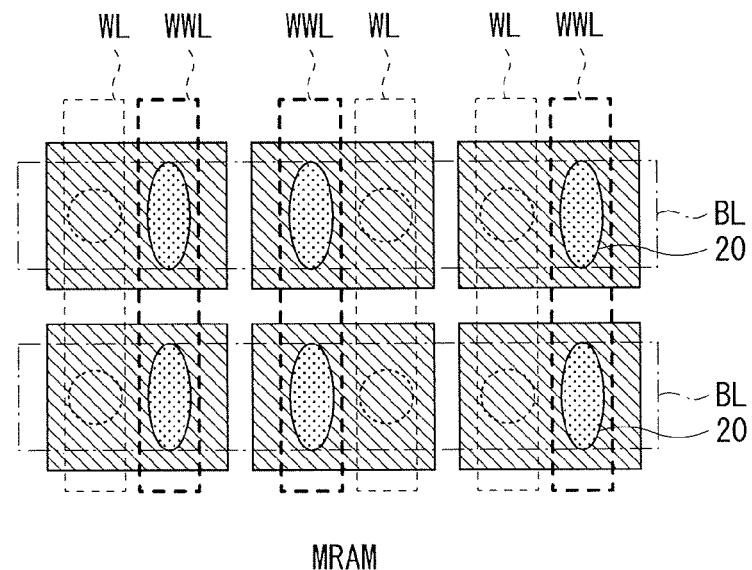
FIG. 4 is a plan view illustrating a configuration of a current magnetic field write type resistance change device.
Figure 5:
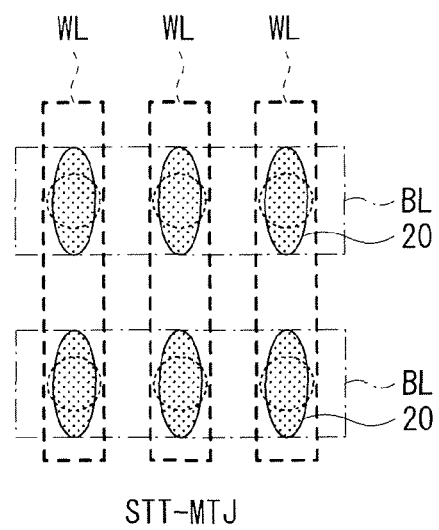
FIG. 5 is a plan view illustrating a configuration of a spin injection magnetization reversal type resistance change device.

FIG. 3 to FIG. 5 are diagrams adapted to explain the reason why it is preferable to configure the resistance change device 20 by the STT-MTJ. Examples of the MTJ device include a current magnetic field write type (MRAM) device in which a magnetic field is generated by making a current flow between a selected bit line BL and a selected word line WL and a spin injection magnetization reversal type (STT-MTJ) device in which information writing is performed by utilizing spin injection magnetization reversal with a current. In the current magnetic field write type device, the current for magnetization reversal is increased with miniaturization of the MTJ device and power consumption is increased accordingly as illustrated in FIG. 3. In addition, since write word lines WWL are included as illustrated in FIG. 4, the cell area is increased. Further, the probability that information may be erroneously written into an adjacent MTJ device due to the magnetic field generated at the time of writing is high.

On the other hand, in the spin injection magnetization reversal type device, the current desired for magnetization reversal is decreased with miniaturization of the MTJ device and hence power consumption saving is promoted as illustrated in FIG. 3. In addition, since the write word lines WWL are unnecessary, the cell area is decreased as illustrated in FIG. 5. Therefore, it becomes possible to cope with high integration and miniaturization.

In addition, it is preferable that the record layer 21 be connected to a drain of the selection transistor 30 and the reference layer 23 be connected to the bit line BL as illustrated in FIG. 1. The reason therefor will be described later.

The selection transistor 30 illustrated in FIG. 1 may be, for example, an N type MOS transistor, and the drain thereof is connected to the record layer 21 of the resistance change device 20, a gate thereof is connected to a word line WL, and a source thereof is connected to a source line SL. In addition, the sources of two selection transistors 30 that are adjacent to each other in an extending direction of the bit line BL are connected to the same source line SL. The bit line BL and the source line SL are connected to a bipolar write pulse/read bias generator 11. The bit line BL is connected to one of terminals of a sense amplifier 12. The other terminal of the sense amplifier 12 is connected to a voltage reference circuit 13.

The semiconductor device 1 includes the plurality of memory cells 10 that are arranged in a matrix, the plurality of word lines WL extending in a row direction (a lateral direction), and the plurality of bit lines BL and the plurality of source lines SL each extending in a column direction (a longitudinal direction) as illustrated in FIG. 2. Each memory cell 10 is connected to the word line WL, the bit line BL, and the source line SL.

Figure 6:
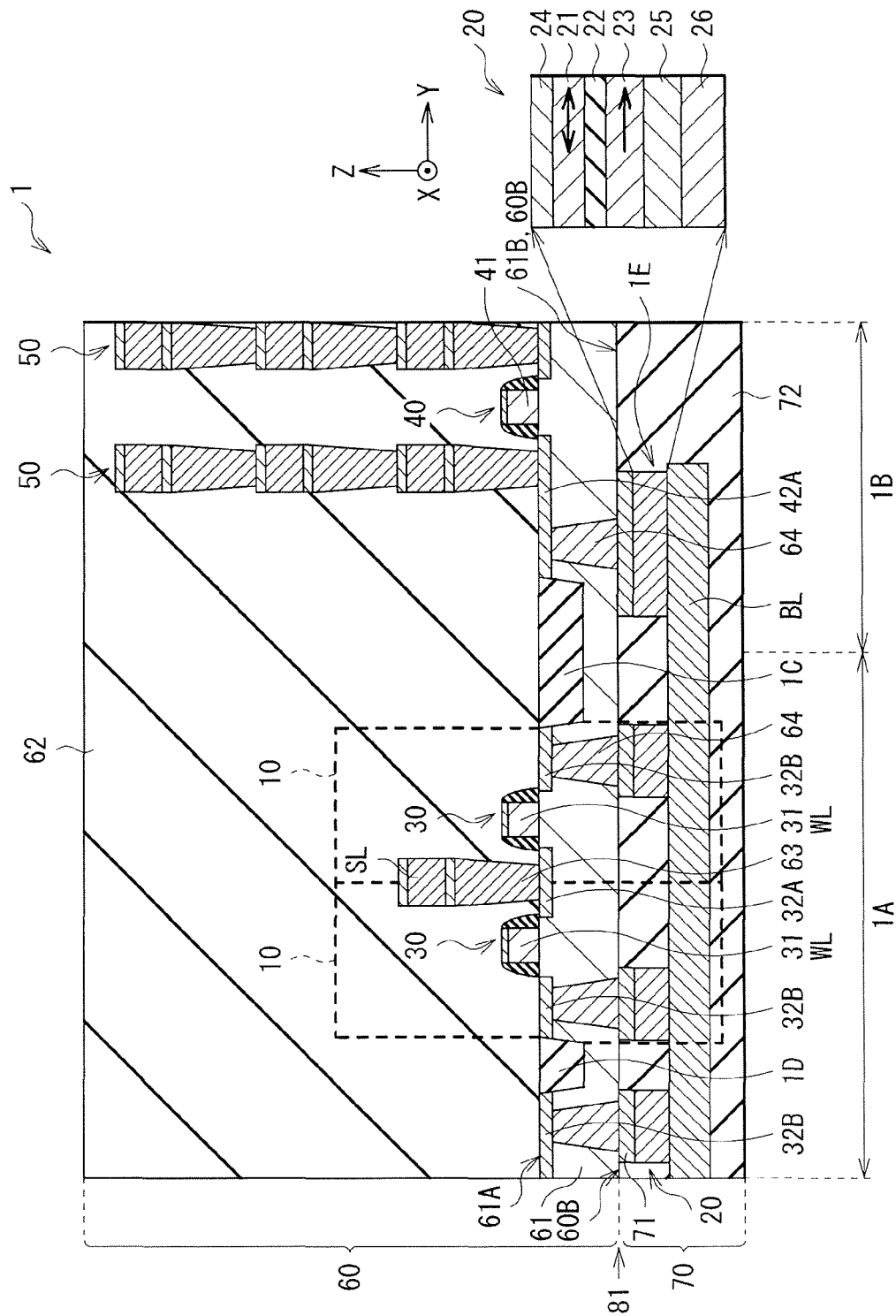
FIG. 6 is a sectional diagram illustrating the configuration of the semiconductor device illustrated in FIG. 1 and FIG. 2.

FIG. 6 illustrates a sectional configuration of the semiconductor device 1 so configured. In the following description, Z indicates a lamination direction and an XY plane indicates a plane orthogonal to the lamination direction.

The semiconductor device 1 is divided into a memory device section 1A and a logic device section 1B in an in-plane direction of the XY plane. The memory device section 1A and the logic device section 1B may be separated from each other, for example, by a device separation layer 1C having an STI (Shallow Trench Isolation) structure.

In the memory device section 1A, the memory cells 10 each including the resistance change device 20 and the selection transistor 30 illustrated in FIG. 1 and FIG. 2 are arranged. The two memory cells 10 that are mutually adjacent in the extending direction of the bit line BL and are not connected to the same source line SL may be separated from each other by, for example, a device separation layer 1D having the STI structure.

The logic device section 1B includes a transistor 40 of a peripheral circuit and a multilayer wiring 50.

On the other hand, the semiconductor device 1 has a configuration in which a first member 60 and a second member 70 are bonded together along a bonding surface 81 when viewed in the lamination direction Z. The first member 60 includes a first substrate 61, and the selection transistor 30 and the transistor 40 of the peripheral circuit are disposed on a front surface 61A side of the first substrate 61. The second member 70 includes the resistance change device 20 and a connection layer 71 that is in contact with the resistance change device 20, and the connection layer 71 is bonded to a back surface 60B of the first member 60. Accordingly, in the semiconductor device 1, it is possible to improve the characteristics of the resistance change device 20.

Specifically, the resistance change device 20 is provided in the second member 70 that is different from the first member 60 having the selection transistor 30, which makes it possible to form the resistance change device 20 on the surface that has no level difference caused by lower layer structures and is high in smoothness, and accordingly it becomes possible to improve the characteristics of the resistance change device 20.

The first member 60 may include, for example, the first substrate 61, the selection transistor 30, the transistor 40 of the peripheral circuit, an interlayer insulating film 62, a front surface contact electrode 63, the source line SL, the multilayer wiring 50, and a back surface contact electrode 64.

The first substrate 61 may have a configuration in which, for example, a semiconductor region (not illustrated) is disposed on an insulating film (not illustrated). The insulating film may be configured of, for example, a silicon nitride (SiN) film, a silicon oxide ($SiO_2$) film, a silicon oxycarbide (SiOC) film, a silicon oxycarbide nitride (SiOCN) film, or a composite film of these films. In addition, the insulating film may be configured of an insulating film made of the material that is used as an interlayer insulating film of the general semiconductor device such as an organic insulating film. The semiconductor region may be configured of, for example, a silicon (Si) layer. It is to be noted that each of the above-mentioned device separation layers 1C and 1D having the STI structure is formed by embedding a silicon oxide film into a device separation groove provided in the semiconductor region.

The selection transistor 30 includes a gate electrode 31 on the front surface 61A of the first substrate 61 with a gate insulating film (not illustrated) in between. Diffusion layers (not illustrated) to be served as source-drain regions are provided in the semiconductor region of the first substrate 61 on both sides of the gate electrode 31. The semiconductor region between these two diffusion layers serves as a channel region of the selection transistor 30.

In addition, low resistance sections 32A and 32B are disposed on front surfaces of the respective diffusion layers. The low resistance section 32A is shared by the two selection transistors 30 that are mutually adjacent in the extending direction of the bit line BL and is connected to the source line SL via the front surface contact electrode 63. The low resistance section 32B is separately provided for each selection transistor 30. The low resistance section 32B is connected to the connection layer 71 and the resistance change device 20 via the back surface contact electrode 64 formed through the first substrate 61. The resistance change device 20 and the selection transistor 30 are connected to each other by the shallow back surface contact electrode 64 in this way, which makes it possible to reduce connection resistance, to improve MOSFET performance, and to improve yield of the back surface contact electrode 64.

The materials of the gate insulating film, the gate electrode 31, the low resistance sections 32A and 32B, and so forth are the same as the materials of the gate insulating film, the gate electrode, and the low resistance sections of the general semiconductor device.

The transistor 40 of the peripheral circuit is disposed on the front surface 61A side of the first substrate 61 in the first member 60. Specifically, the transistor 40 of the peripheral circuit includes a gate electrode 41 with a gate insulating film (not illustrated) in between on the front surface 61A of the first substrate 61. Diffusion layers (not illustrated) to be served as source-drain regions are provided in the semiconductor region of the first substrate 61 on both sides of the gate electrode 41. The semiconductor region between these two diffusion layers serves as a channel region of the transistor 40.

In addition, low resistance sections 42A and 42B are provided on front surfaces of the respective diffusion layers. The multilayer wiring 50 is connected to the low resistance sections 42A and 42B. The multilayer wiring 50 is formed by laminating a plurality of layers (for example, about three layers in the example in FIG. 6) of contact electrodes and wirings.

The materials of the gate insulating film, the gate electrode 41, the low resistance sections 42A and 42B, and so forth are the same as the materials of the gate insulating film, the gate electrode, and the low resistance sections of the general semiconductor device.

The interlayer insulating film 62 may have a thickness of, for example, several hundred nm or more and the front surface thereof is flattened. A support substrate (not illustrated) may be provided on the interlayer insulating film 62.

The second member 70 includes the resistance change device 20, the connection layer 71, and the bit line BL (or a power source line). The resistance change device 20, the connection layer 71, and the bit line BL are embedded in the substrate or a protection film (an interlayer insulating film) 72.

The resistance change device 20 is a spin injection magnetization reversal type memory device that includes a cap layer 24, the record layer 21, the tunnel barrier layer 22, the reference layer 23, an antiferromagnetic layer 25, and a buffer layer 26 in this order starting from a side close to the connection layer 71 as illustrated with an enlarged size in FIG. 6. In other words, the resistance change device 20 has a bottom pin structure that includes the reference layer 23, the tunnel barrier layer 22, and the record layer 21 in this order from bottom to top in the lamination direction Z, and the record layer 21 is connected to the drain of the selection transistor 30.

Figure 7:
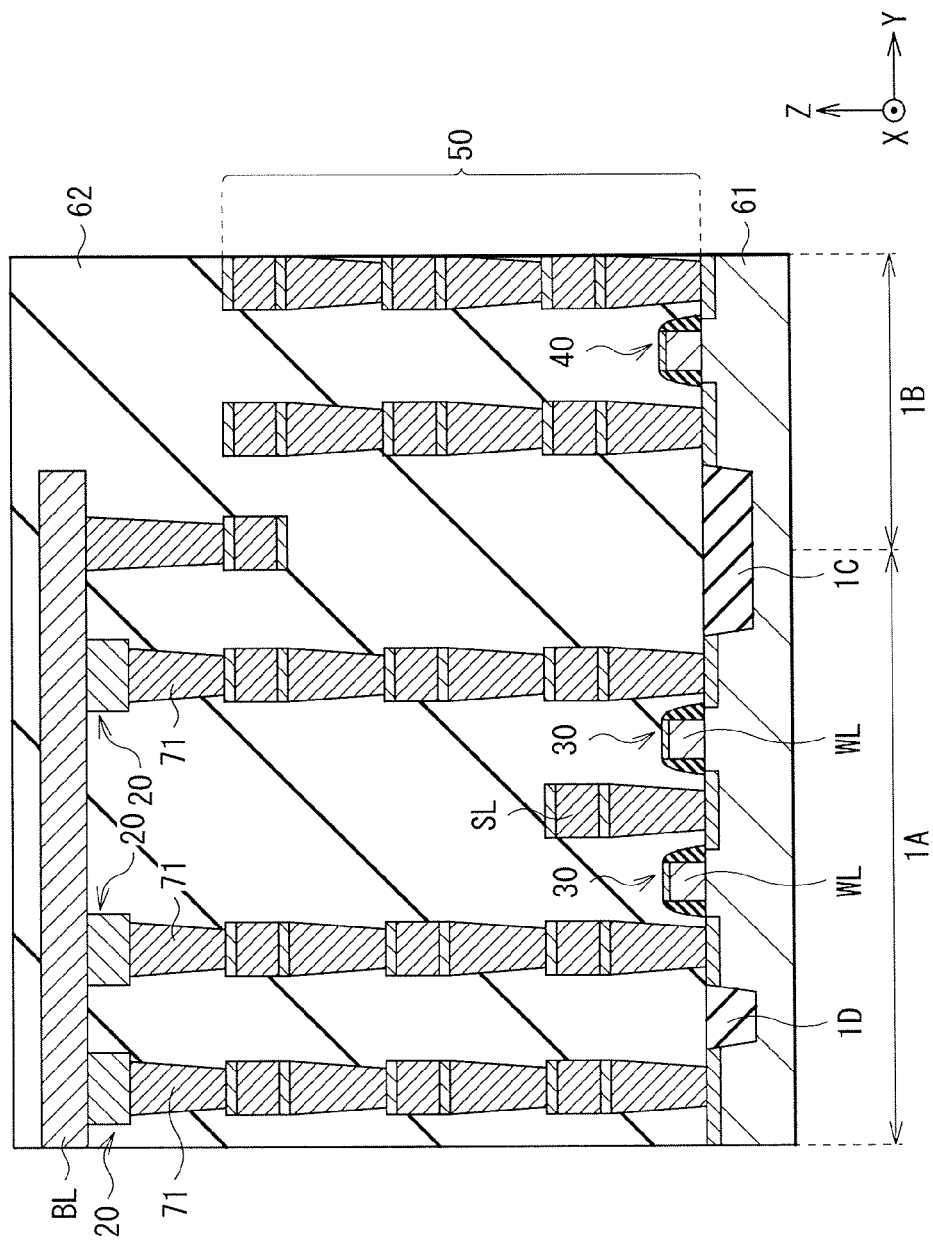
FIG. 7 is a sectional diagram illustrating a configuration of a semiconductor device of a reference example 1 in which the resistance change device is formed on an upper part of a multilayer wiring.
Figure 8:
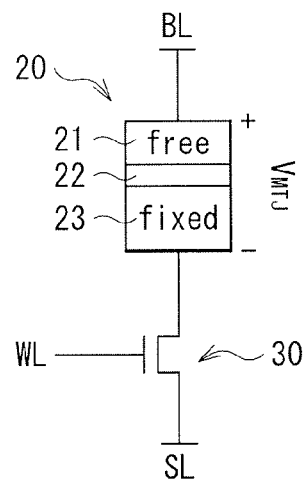
FIG. 8 is a diagram illustrating an example of a connection configuration between the resistance change device and a selection transistor.

The above-mentioned matter will be described with reference to FIG. 7 to FIG. 9. The MTJ is formed at a low temperature in order to minimize the damage by heat history to the magnetic material. Although it is desirable to lower the process temperature throughout the manufacturing process when regarding characteristics such as TMR (tunnel magnetoresistance) and so forth as important, the reliability of the transistors 30 and 40 and the wiring may be probably reduced when the process temperature has been lowered. In addition, in a nonvolatile logic and a magnetic memory, the peripheral circuit that includes the sense amplifier 12, the driving transistor 40, and so forth has a multilayer wiring structure of about four or more layers. Therefore, from the viewpoint of heat resistance and reliability, the resistance change device 20 configured of the MTJ is formed on an upper part of the multilayer wiring 50 in many cases as illustrated in FIG. 7. In this case, wiring resistance and parasitic capacitance may be increased and a high-speed operation may probably become difficult.

In addition, the upper part of the multilayer wiring 50 has many level differences caused by the lower layer structures such as the contact electrode and the wiring and thus is low in smoothness. Therefore, if the MTJ having a top pin structure that includes the record layer 21, the tunnel barrier layer 22, and the reference layer 23 in this order from bottom to top in the lamination direction Z is formed on the upper part of the multilayer wiring 50, the characteristics of the antiferromagnetic material (InMn is mainly used) may be degraded and the TMR may be reduced. Therefore, when the MTJ is formed on the upper part of the multilayer wiring 50, it is general to adopt the bottom pin structure that includes the reference layer 23, the tunnel barrier layer 22, and the record layer 21 in this order from bottom to top in the lamination direction Z as illustrated in FIG. 8.

Figure 9:
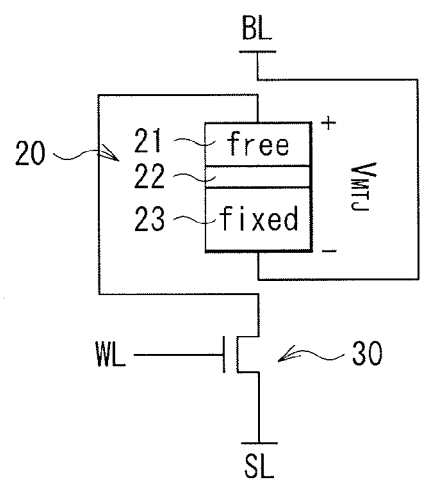
FIG. 9 is a diagram illustrating another example of the connection configuration between the resistance change device and the selection transistor.

It is to be noted that it is also possible to form the MTJ having the bottom pin structure on the upper part of the multilayer wiring 50 and to connect the record layer 21 to the drain of the selection transistor 30 by routing of wiring as illustrated in FIG. 9. However, a configuration for routing of wiring is complicated and the cell area is increased in the above-mentioned case.

On the other hand, the first embodiment is configured such that the second member 70 having the resistance change device 20 is bonded to the back surface 60B of the first member 60 that includes the selection transistor 30 as illustrated in FIG. 6. Accordingly, it becomes possible to form the resistance change device 20 on the surface that has no level difference caused by the lower layer structures and is high in smoothness and thus it becomes possible to improve the characteristics of the resistance change device 20. In addition, increases in wiring resistance and parasitic capacitance illustrated in FIG. 7 are also eliminated and the high-speed operation becomes possible. Further, it becomes possible to apply a fine design rule by arranging the resistance change device 20 on the back surface 60B side of the first member 60 and thus formation of a memory of large capacity is facilitated.

In addition, in the first embodiment, it becomes possible to connect the record layer 21 to the drain of the selection transistor 30 by adopting such a bonding configuration, without performing complicated routing of wiring illustrated in FIG. 9 while maintaining the bottom pin structure. In other words, the characteristics of the antiferromagnetic material made of PtMn are improved and the characteristics such as the TMR are increased by adopting the bottom pin structure. Further, it becomes possible to drive the selection transistor 30 with a small current and asymmetry of the write current is moderated (a deviation in switching voltage is reduced) by connecting the record layer 21 to the drain of the selection transistor 30.

The materials of the respective layers of the resistance change device 20 illustrated in FIG. 6 will be described. In a typical structural example of the in-plane magnetization type device, the antiferromagnetic layer 25 is configured of the antiferromagnetic material made of PtMn, IrMn, and so forth. The reference layer 23 has the laminated structure configured of the antiferromagnetic material made of PtMn, IrMn, and so forth, and the single layer of CoFe, CoFeB, and so forth or the laminated ferri-structure of CoFe/Ru/CoFeB and so forth. The tunnel barrier layer 22 may be configured of an oxide film made of, for example, AlO, MgO, and so forth. The record layer 21 may be configured of, for example, the single layer of CoFe, CoFeB, NiFe, and so forth or the laminated structure in which the layer of Ru, MgO, or the like is sandwiched between the layers of CoFe, CoFeB, NiFe, and so forth.

The buffer layer 26 may be configured of, for example, a single layer or a laminated film of copper (Cu), ruthenium (Ru), tantalum (Ta), titanium (Ti), tungsten (W), TiN, and so forth. The materials of the cap layer 24 are same as those of the buffer layer 26.

The connection layer 71 and the bit line BL illustrated in FIG. 6 have functions of serving as two electrodes of the resistance change device 20. The connection layer 71 is separated into parts for each of the plurality of resistance change devices 20. On the other hand, the bit line BL is provided as a wiring that is common to the plurality of resistance change devices 20. Each of the connection layer 71 and the bit line BL may be configured of the single layer or the laminated film of, for example, copper (Cu), ruthenium (Ru), tantalum (Ta), titanium (Ti), tungsten (W), TiN, and so forth.

Further, the diffusion layer of the selection transistor 30 of the memory device section 1A and the diffusion layer of the transistor 40 of the logic device section 1B are connected together via as connection section 1E. The connection section 1E may be disposed between the low resistance section 42A of the transistor 40 of the peripheral circuit and the bit line BL extended in the logic device section 1B, and has a configuration in which the back surface contact electrode 64, the connection layer 71, and the resistance change device 20 are laminated in this order. This makes it possible to form the connection section 1E in the same process as that of the back surface contact electrode 64, the connection layer 71, and the resistance change device 20, and makes it possible to simplify the configuration and the manufacturing process of the connection section 1E. It is to be noted that it is preferable that the resistance change device 20 to be connected to the connection section 1E be larger in area than the resistance change device 20 (the resistance change device 20 that operates as a memory device) in the memory cell 10 for resistance reduction of the connection section 1E. Information writing into the resistance change device 20 to be connected to the connection section 1E does not occur with a current with which writing into the resistance change device 20 operating as the memory device is performed by making the area of the resistance change device 20 to be connected to the connection section 1E larger than the area of the resistance change device 20 operating as the memory device.

The semiconductor device 1 may be manufactured, for example, in the following manner.

Figure 10:
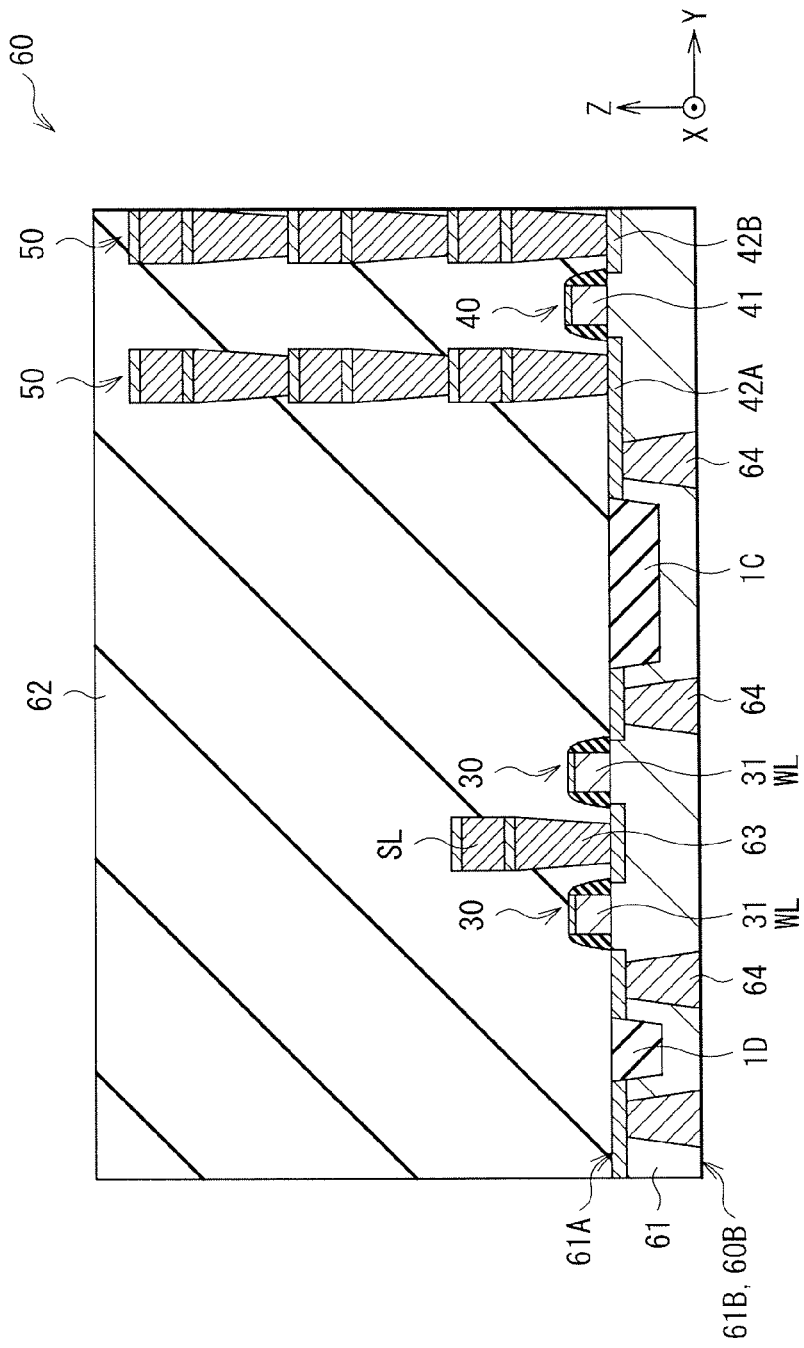
FIG. 10 is a sectional diagram illustrating a method of manufacturing the semiconductor device illustrated in FIG. 6 in order of processes.

FIG. 10 to FIG. 13 are diagrams illustrating a method of manufacturing the semiconductor device 1 in order of processes. First, as illustrated in FIG. 10, the selection transistor 30, the transistor 40 of the peripheral circuit, the interlayer insulating film 62, the front surface contact electrode 63, the source line SL, and the multilayer wiring 50 are formed on the front surface 61A side of the first substrate 61. In addition, the first substrate 61 is turned over and the back surface contact electrode 64 is formed on the back surface 61B of the first substrate 61. The back surface contact electrode 64 reaches the low resistance section 32B of the selection transistor 30 or the low resistance section 42A of the transistor 40 of the peripheral circuit. Thus, the first member 60 is formed.

Figure 11:
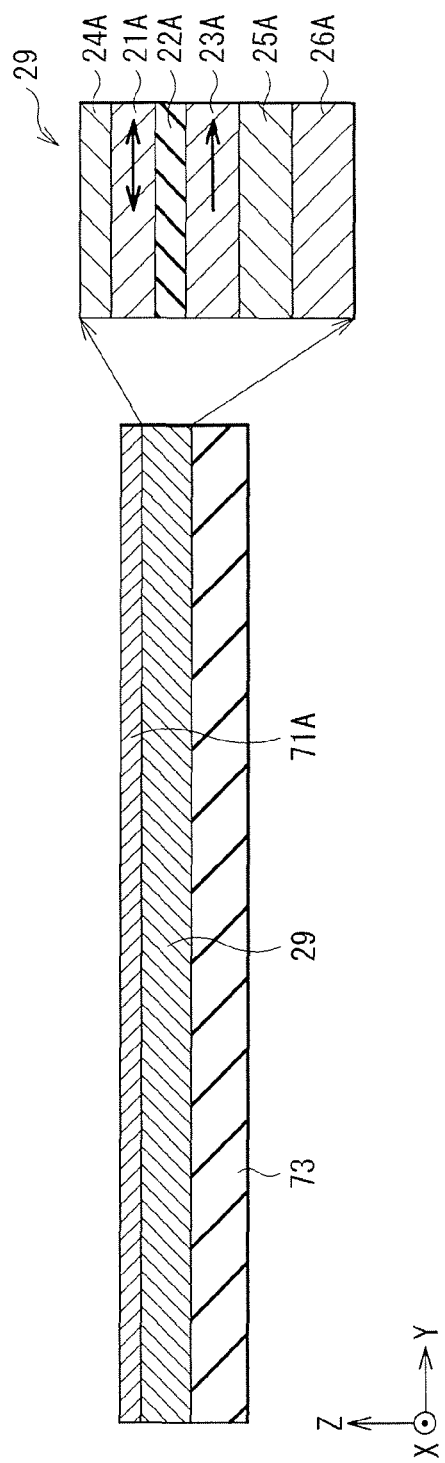
FIG. 11 is a sectional diagram illustrating a process following the processes in FIG. 10.

Then, as illustrated in FIG. 11, a resistance change device material film 29 and a connection layer material film 71A are formed on a second substrate 73. As the second substrate 73, a monocrystalline substrate such as a Si substrate, a GaAs substrate, and an MgO substrate may be preferable from the viewpoint of smoothness and magnetic characteristics. As a film deposition method, a sputtering method, a vapor deposition method, a CVD (Chemical Vapor Deposition) method, and so forth may be used. As the resistance change material film 29, a buffer layer material film 26A, an antiferromagnetic layer material film 25A, a reference layer material film 23A, a tunnel barrier layer material film 22A, a record layer material film 21A, and a cap layer material film 24A are formed in this order starting from a side close to the second substrate 73 as illustrated with an enlarged size in FIG. 11.

Figure 12:
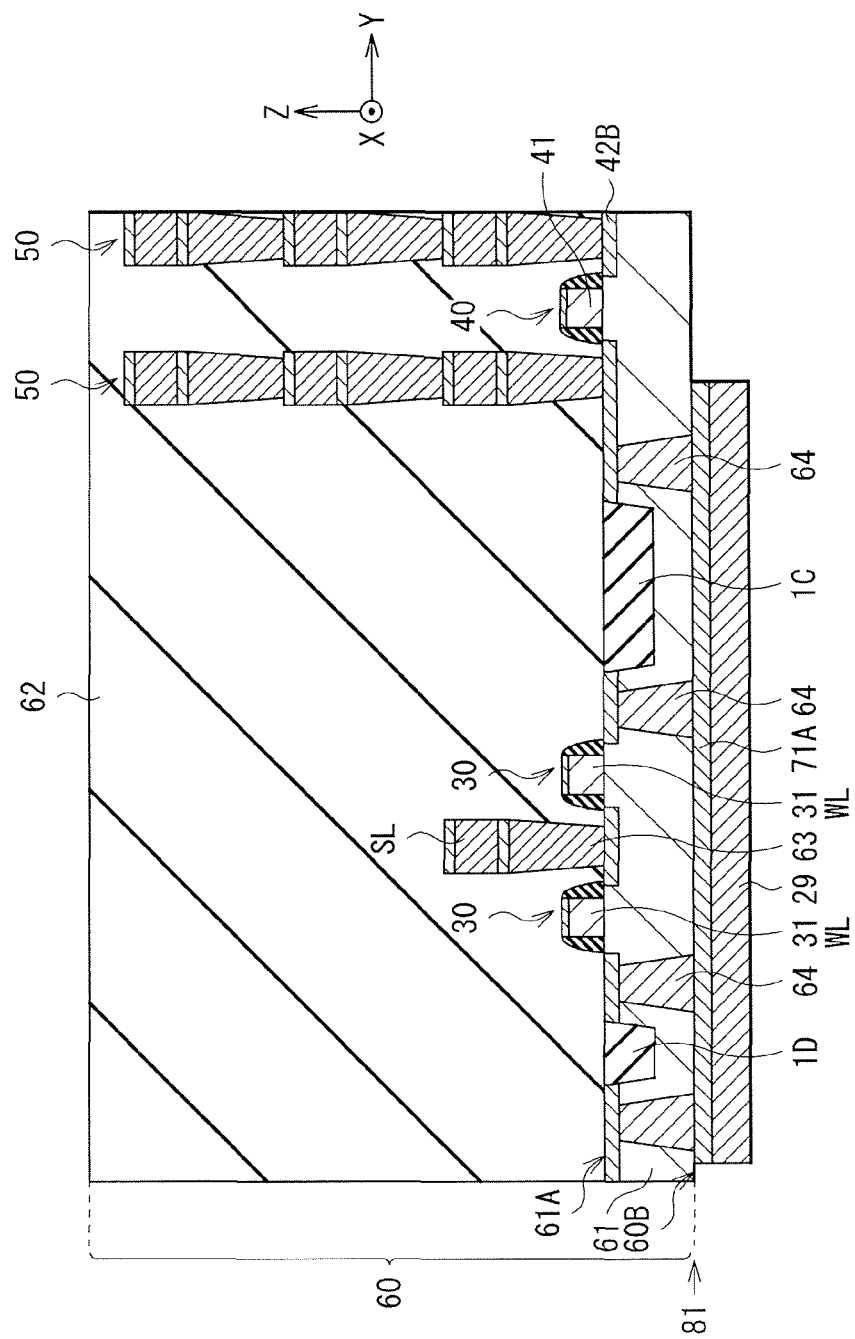
FIG. 12 is a sectional diagram illustrating a process following the process in FIG. 11.

Then, the second substrate 73 on which the resistance change device material film 29 and the connection layer material film 71A are formed may be bonded to the back surface 60B of the first member 60 by using a substrate bonding technique such as, for example, normal temperature bonding and the second substrate 73 is removed by etching and so forth as illustrated in FIG. 12. Here, the second substrate 73 on which the resistance change device material film 29 and the connection layer material film 71A are formed may be bonded to the entire back surface 60B of the first member 60 or may be partially bonded only to a portion where the resistance change device 20 is to be formed.

Figure 13:
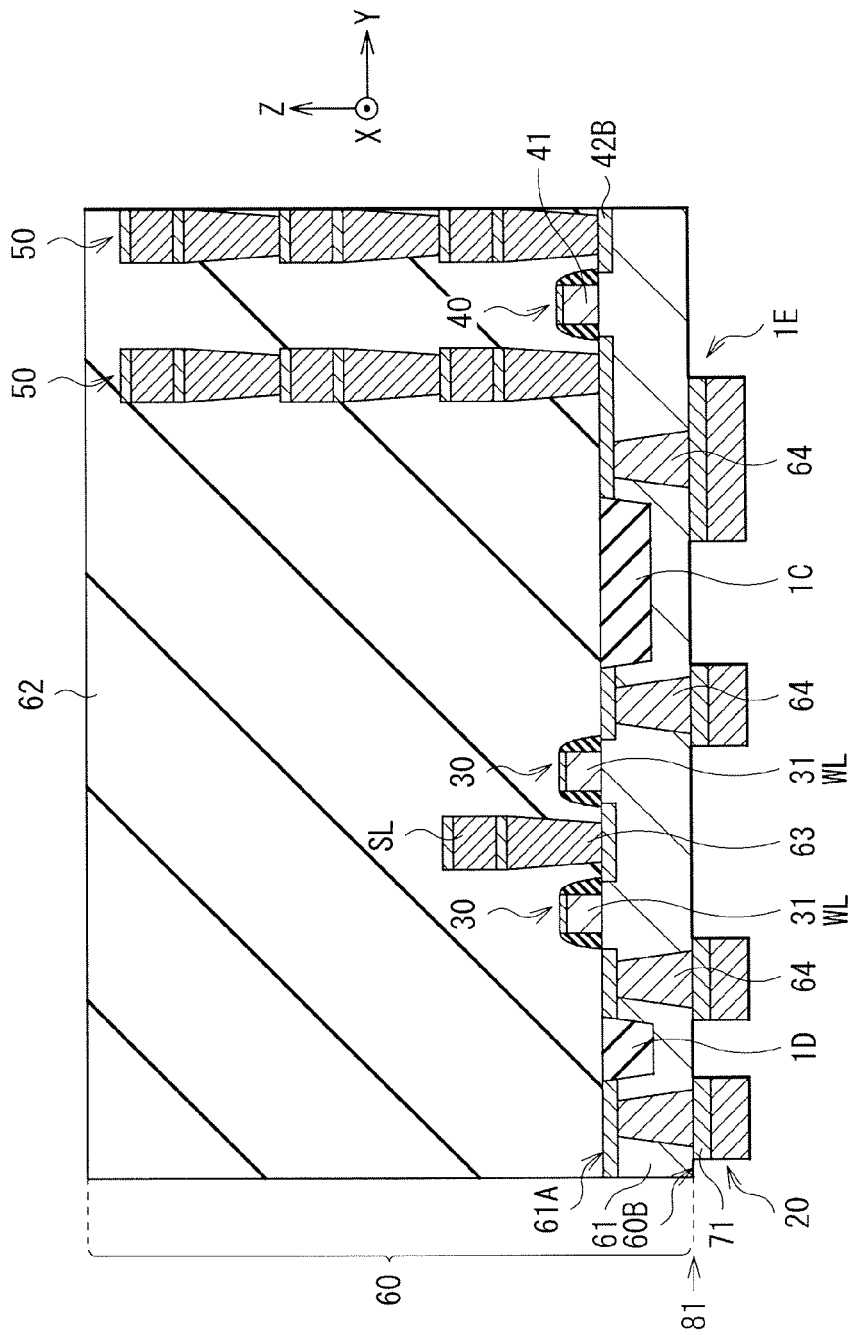
FIG. 13 is a sectional diagram illustrating a process following the process in FIG. 12.

Thereafter, the resistance change device material film 29 and the connection layer material film 71A are patterned into desired shapes by RIE (Reactive Ion Etching), ion milling, or the like, to form the resistance change device 20 and the connection layer 71 as illustrated in FIG. 13. The connection layer 71 is bonded to the back surface 60B of the first member 60.

Here, the plane of the resistance change device 20 has an elliptic shape or a shape similar to the elliptic shape so as to attain an aspect ratio of about 1.5 to about 2.5 both inclusive in the case of the in-plane magnetization type device as illustrated in FIG. 5. Further, it is preferable that the aspect ratio be about 2 or more from the viewpoint of improvement in record holding characteristics.

Further, the protection film 72 is formed so as to embed the resistance change device 20 and the connection layer 71 and the bit line BL is formed. The bit line BL may be formed mainly using a material such as Cu by, for example, a dual damascene method and so forth. Further, the bit line BL is embedded with the protection film 72. As a result of the above, formation of the semiconductor device 1 illustrated in FIG. 6 is completed.

In this semiconductor device 1, a current is applied in a film surface vertical direction of the resistance change device 20 according to whether potentials of the source line SL and the bit line BL are high or low and spin torque magnetization reversal occurs. Thus, the resistance of the resistance change device 20 is changed to a high or low value by directing the magnetization of the record layer 21 parallel with or antiparallel to the magnetization of the reference layer 23, thereby executing information writing.

On the other hand, in order to read out information stored in the resistance change device 20, a magnetic layer (not illustrated) to serve as a reference of the information is disposed on the resistance change device 20 with a thin insulating film in between, thereby reading out the information with a ferromagnetic tunnel current flowing through the tunnel barrier layer 22.

Here, since the resistance change device 20 and the connection layer 71 are provided in the second member 70 that is different from the first member 60 including the selection transistor 30, the resistance change device 20 is formed on the surface that has no level difference caused by the lower layer structures and is high in smoothness and therefore the characteristics of the resistance change device 20 are improved. In addition, the increases in wiring resistance and parasitic capacitance illustrated in FIG. 7 are eliminated and the high-sped operation becomes possible.

In addition, the resistance change device 20 has the bottom pin structure that includes the reference layer 23, the tunnel barrier layer 22, and the record layer 21 in this order from bottom to top in the lamination direction Z, and the record layer 21 is connected to the drain of the selection transistor 30. Therefore, the characteristics of the antiferromagnetic material made of PtMn are improved and the characteristics such as the TMR are increased by adopting the bottom pin structure. In addition, the selection transistor 30 is driven with a small current and the asymmetry of the write current is mitigated (the deviation of switching voltage is reduced) by connecting the record layer 21 to the drain of the selection transistor 30.

Since, in the first embodiment, the resistance change device 20 and the connection layer 71 are disposed in the second member 70 that is different from the first member 60 including the selection transistor 30 as described above, the resistance change device 20 is allowed to be formed on the surface that has no level difference caused by the lower layer structures and is high in smoothness and therefore it becomes possible to improve the characteristics of the resistance change device 20. In addition, the increases in wiring resistance and parasitic capacitance illustrated in FIG. 7 are eliminated and the high-speed operation becomes possible. Further, it becomes possible to apply the fine design rule by arranging the resistance change device 20 on the back surface 60B of the first member 60, thereby facilitating formation of the memory of large capacity.

In addition, the resistance change device 20 has the bottom pin structure that includes the reference layer 23, the tunnel barrier layer 22, and the record layer 21 in this order from bottom to top in the lamination direction Z, and the record layer 21 is connected to the drain of the selection transistor 30. Therefore, the characteristics of the antiferromagnetic material made of PtMn are improved and the characteristics such as the TMR are increased by adopting the bottom pin structure. In addition, it becomes possible to drive the selection transistor 30 with the small current and the asymmetry of the write current is mitigated (the deviation of switching voltage is reduced) by connecting the record layer 21 to the drain of the selection transistor 30.

Second Embodiment

Figure 14:
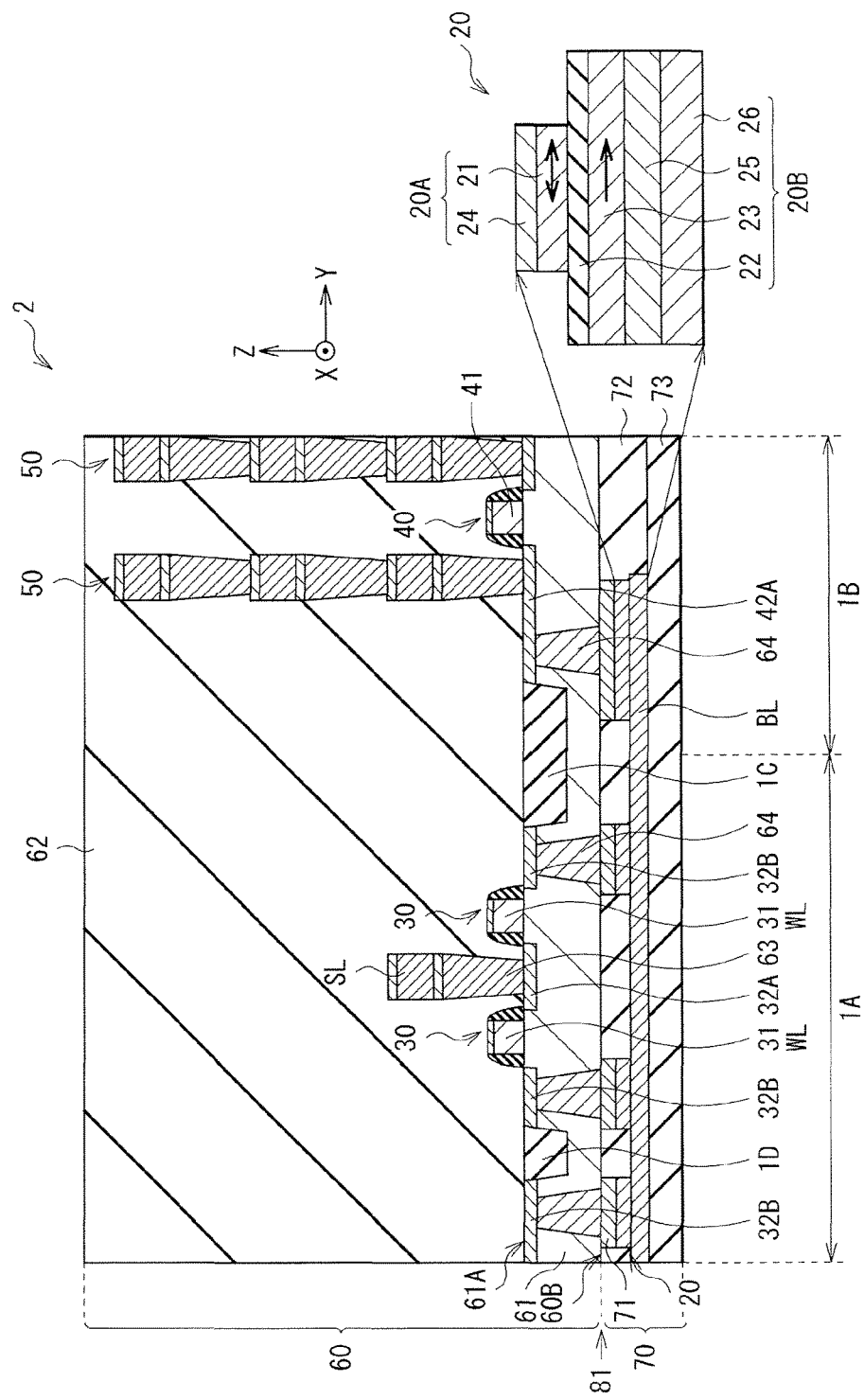
FIG. 14 is a sectional diagram illustrating a configuration of a semiconductor device according to a second embodiment of the present disclosure.

FIG. 14 is a diagram illustrating an example of a sectional configuration of a semiconductor device 2 according to a second embodiment of the present disclosure. In the second embodiment, insulation and reliability of the tunnel barrier layer 22 is improved by not processing the tunnel barrier layer 22 of the resistance change device 20. The semiconductor device 2 has the same configuration, function, and effects as the semiconductor device 1 according to the above-mentioned first embodiment except for the above-mentioned point. Accordingly, description will be made by assigning the same numerals to the corresponding constitutional elements.

The plurality of resistance change devices 20 are provided in the second member 70. The plurality of resistance change devices 20 include a discrete laminated section 20A that includes the record layer 21 and is separated into parts for each of the plurality of resistance change devices 20 and a common laminated section 20B that includes the tunnel barrier layer 22 and the reference layer 23 and is common to the plurality of resistance change devices 20.

It is preferable that the common lamination section 20B also serve as a wiring that is common to the plurality of resistance change devices 20, specifically, the bit line BL. Simplification and cost saving of the manufacturing process become possible by omitting the process of forming the bit line BL.

The connection layer 71 is separated into parts for each of the plurality of resistance change devices 20 together with the discrete laminated section 20A.

The semiconductor device 2 may be manufactured, for example, in the following manner.

FIG. 15 to FIG. 21 are diagrams illustrating a method of manufacturing the semiconductor device 2 in order of processes. It is to be noted that with respect to the processes that are the same as those in the first embodiment, description will be made with reference to FIG. 10 to FIG. 13.

First, the first member 60 is formed by the process illustrated in FIG. 10 in the same way as in the first embodiment.

Then, the resistance change device material film 29 and the connection layer material film 71A are formed on the second substrate 73 by the process illustrated in FIG. 11 in the same way as in the first embodiment. As the resistance change device material film 29, the buffer layer material film 26A, the antiferromagnetic layer material film 25A, the reference layer material film 23A, the tunnel barrier layer material film 22A, the record layer material film 21A, and the cap layer material film 24A are formed in this order starting from the side close to the second substrate 73 as illustrated with the enlarged size in FIG. 11.

Figure 15:
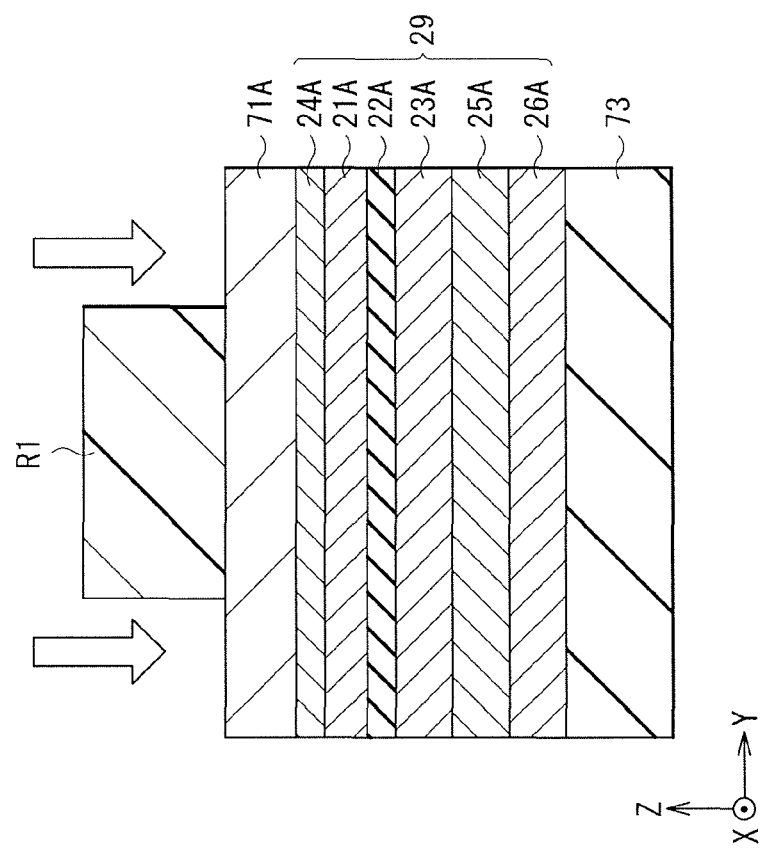
FIG. 15 is a sectional diagram illustrating a method of manufacturing the semiconductor device illustrated in FIG. 14 in order of processes.
Figure 16:
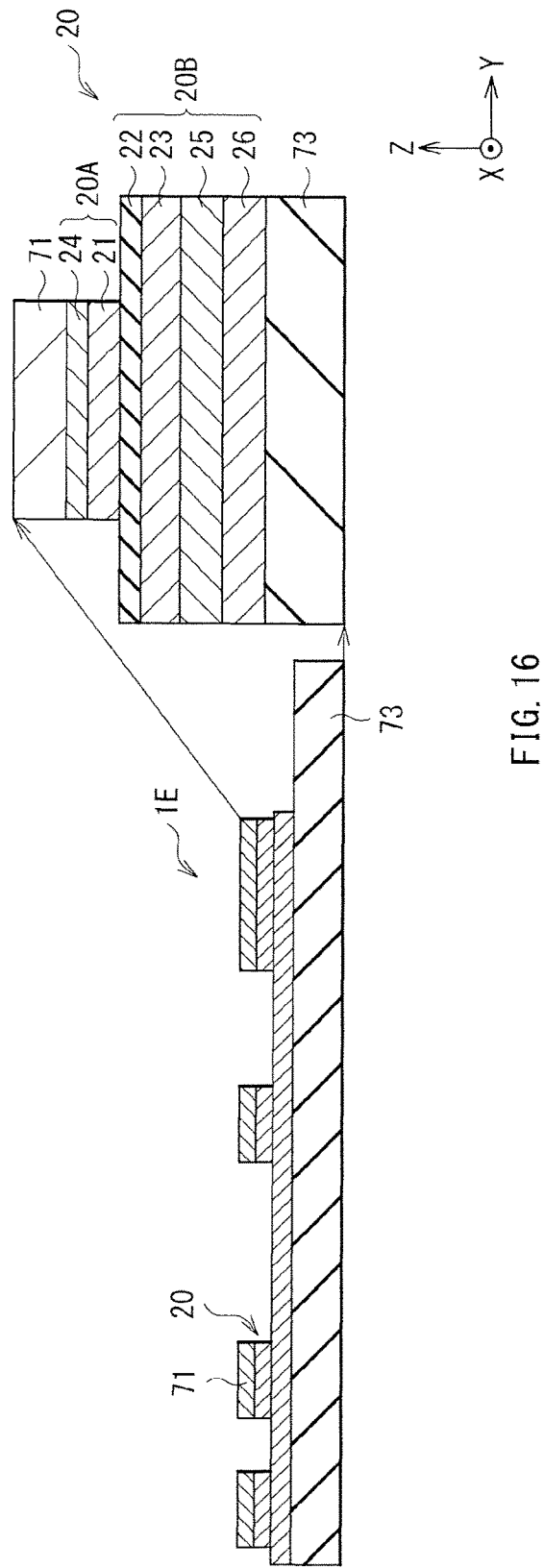
FIG. 16 is a sectional diagram illustrating a process following the processes in FIG. 15.

Then, a resist R1 is formed on the connection layer material film 71A as illustrated in FIG. 15.

Thereafter, the connection layer material film 71A and the resistance change device material film 29 are patterned by the RIE, the ion milling, or the like by using the resist R1 as the mask to form the connection layer 71 and the plurality of resistance change devices 20.

In that case, the discrete laminated section 20A that includes the cap layer 24 and the record layer 21 and the common laminated section 20B that includes the tunnel barrier layer 22, the reference layer 23, the antiferromagnetic layer 25, and the buffer layer 26 are provided for the plurality of resistance change devices 20. The discrete laminated section 20A is separated into parts for each of the plurality of the resistance change devices 20. The connection layer 71 is formed by being separated into parts for each of the plurality of the resistance change devices 20 together with the discrete laminated section 20A. The common laminated section 20B is continuously provided across the plurality of the resistance change devices 20.

The damage to the tunnel barrier layer 22 upon etching is suppressed and degradation of insulation of the tunnel barrier layer 22 caused by re-deposition that would occur when etching the reference layer 23 and succeeding layers is suppressed by not processing the tunnel barrier layer 22 and processing the layers up to the record layer 21. Thus, it becomes possible to improve the insulation and the reliability of the tunnel barrier layer 22.

As with the first embodiment, the plane of the resistance change device 20 has the elliptic shape or the shape similar to the elliptic shape so as to attain the aspect ratio of about 1.5 to about 2.5 both inclusive in the case of the in-plane magnetization type device as illustrated in FIG. 5. Further, it is preferable that the aspect ratio be about 2 or more from the viewpoint of improvement in record holding property.

Figure 17:
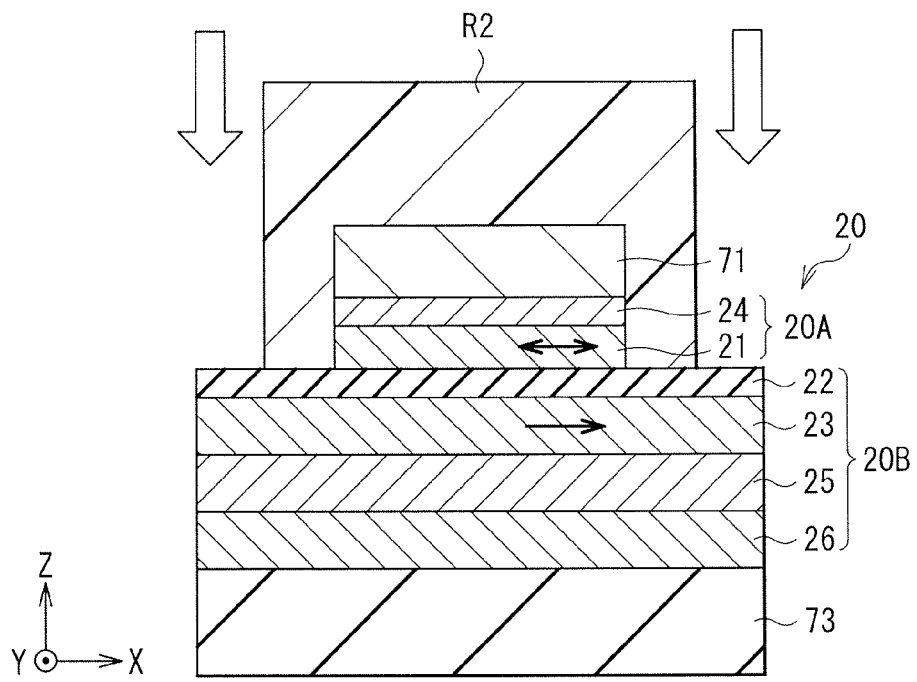
FIG. 17 is a sectional diagram illustrating a process following the process in FIG. 16.

Then, a resist R2 that covers the discrete laminated section 20A is formed as illustrated in FIG. 17.

Figure 18:
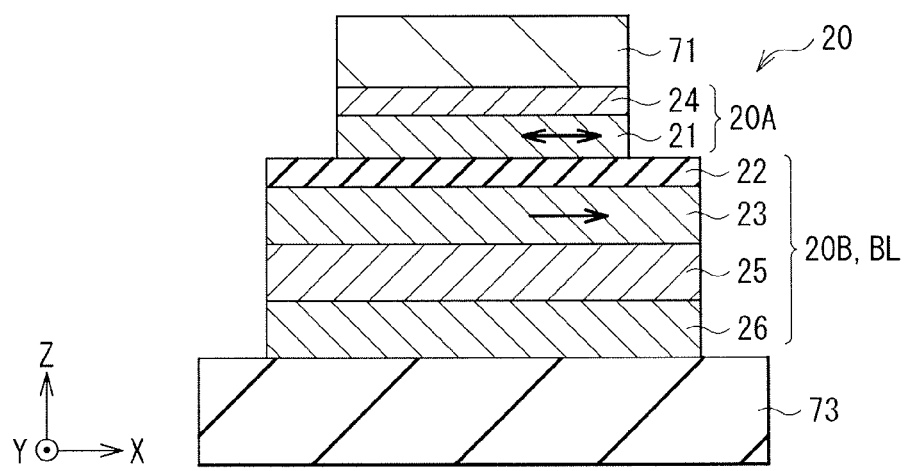
FIG. 18 is a sectional diagram illustrating a process following the process in FIG. 17.
Figure 19:
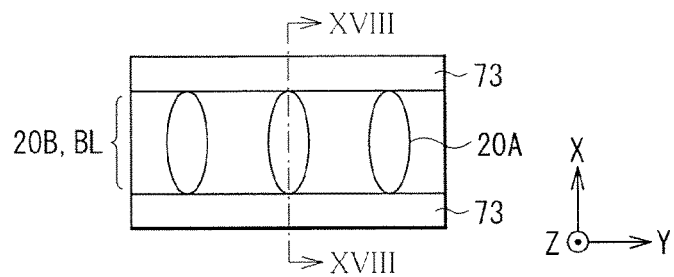
FIG. 19 is a top plan view illustrating the process illustrated in FIG. 18.

Thereafter, the common laminated section 20B is patterned by the REI, the ion milling, or the like by using the resist R2 as a mask to form the bit line BL as illustrated in FIG. 18 and FIG. 19. Thus, the common laminated section 20B is made to also serve as the bit line BL.

Figure 20:
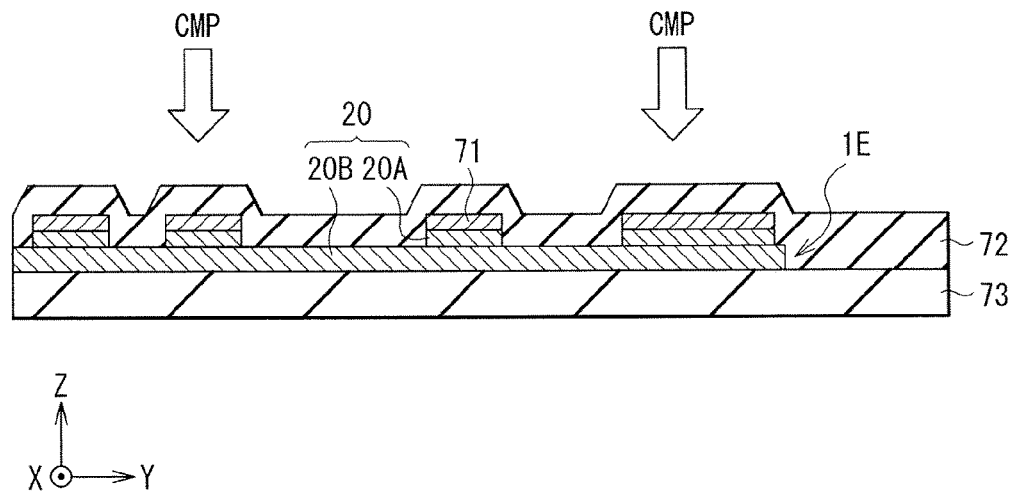
FIG. 20 is a sectional diagram illustrating a process following the process in FIG. 18.
Figure 21:
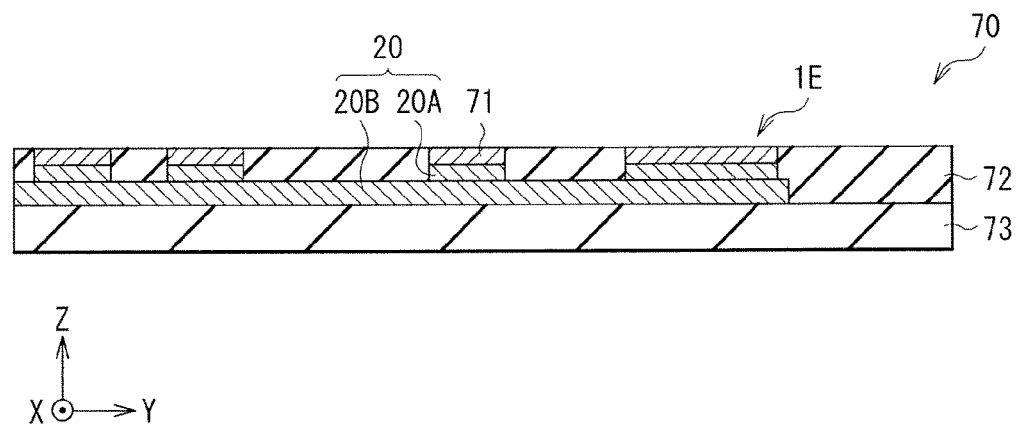
FIG. 21 is a sectional diagram illustrating a process following the process in FIG. 20.

After formation of the bit line BL, the protection film (the interlayer insulating film) 72 is formed so as to embed the connection layer 71 and the resistance change device 20 as illustrated in FIG. 20. Then, the protection film 72 may be polished, for example, by CMP (Chemical Mechanical Polishing) to expose the connection layer 71 as illustrated in FIG. 21. Thus, the second member 70 in which the resistance change device 20 and the connection layer 71 are formed on the second substrate 73 is formed.

Then, the second member 70 may be bonded to the back surface 60B of the first member 60 by using, for example, the substrate bonding technique such as normal temperature bonding and so forth. The second substrate 73 may be either left or removed by etching and so forth. As a result of the above, formation of the semiconductor device 2 illustrated in FIG. 14 is completed.

Since, in the second embodiment, the common laminated section 20B that includes the tunnel barrier layer 23 and the reference layer 23 of the resistance change device 20 is not processed, it becomes possible to improve the insulation and reliability of the tunnel barrier layer 22. In addition, since the common laminated section 20B is used as the bit line BL that is common to the plurality of resistance change devices 20, both of process reduction and cost saving become possible.

Third Embodiment

Figure 22:
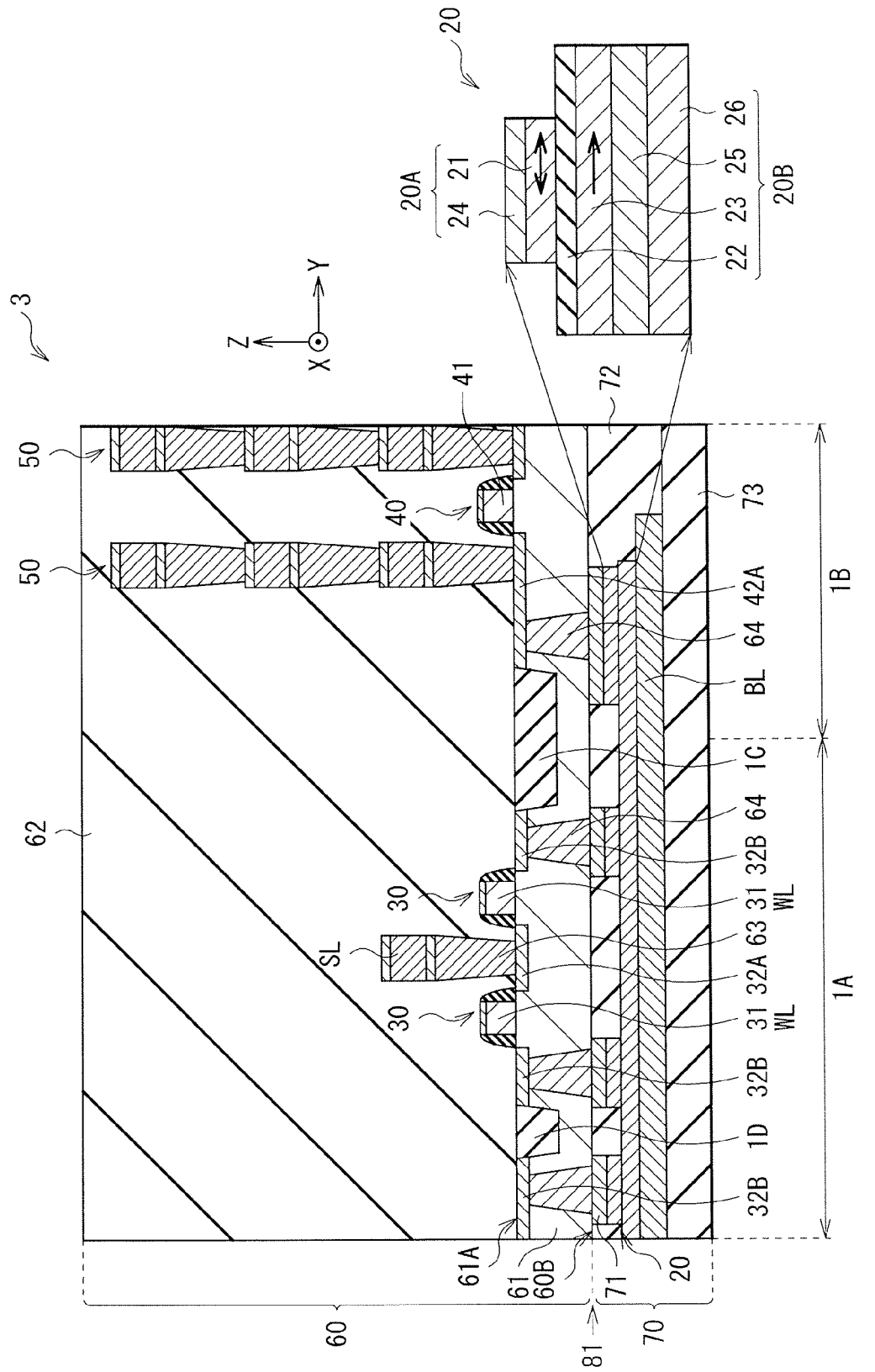
FIG. 22 is a sectional diagram illustrating a configuration of a semiconductor device according to a third embodiment of the present disclosure.

FIG. 22 is a diagram illustrating a sectional configuration of a semiconductor device 3 according to a third embodiment of the present disclosure. In the third embodiment, the bit line BL is provided separately from the common laminated section 20B of the resistance change device 20. The semiconductor device 3 has the same configuration, function, and effects as the semiconductor device 2 of the second embodiment except for the above-mentioned point. Therefore, description will be made by assigning the same numerals to the corresponding constitutional elements.

The semiconductor device 3 may be manufactured, for example, in the following manner.

FIG. 23 to FIG. 27 are diagrams illustrating a method of manufacturing the semiconductor device 3 in order of processes. It is to be noted that with respect to the processes that are the same as those in the first embodiment, description will be made with reference to FIG. 10 to FIG. 13 and with respect to the processes that are the same as those in the second embodiment, description will be made with reference to FIG. 15 to FIG. 21.

First, the first member 60 is formed by the process illustrated in FIG. 10 in the same way as in the first embodiment.

Figure 23:
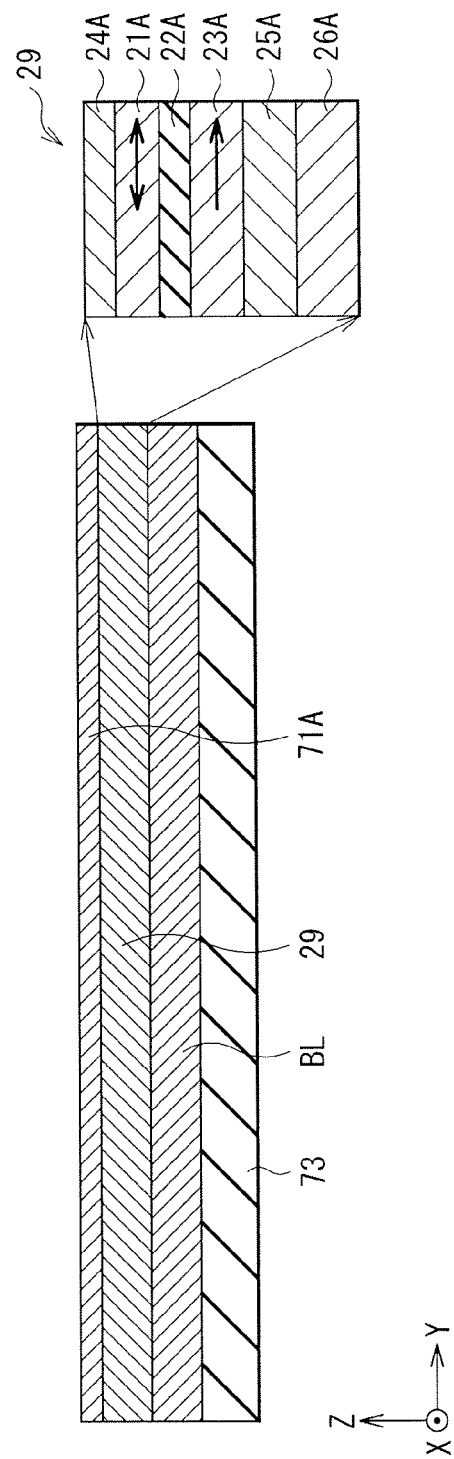
FIG. 23 is a sectional diagram illustrating a method of manufacturing the semiconductor device illustrated in FIG. 22 in order of processes.

Then, after the bit line BL is formed on the second substrate 73, the resistance change device material film 29 and the connection layer material film 71A are formed on the entire surface on which the bit line BL has been formed, as illustrated in FIG. 23. As the film deposition method, it is possible to use the sputtering method, the vapor deposition method, the CVD method, and so forth as in the case in the first embodiment. As the resistance change device material film 29, the buffer layer material film 26A, the antiferromagnetic layer material film 25A, the reference layer material film 23A, the tunnel barrier layer material film 22A, the record layer material film 21A, and the cap layer material film 24A are formed in this order starting from the side close to the second substrate 73 as illustrated with an enlarged size in FIG. 23.

Figure 24:
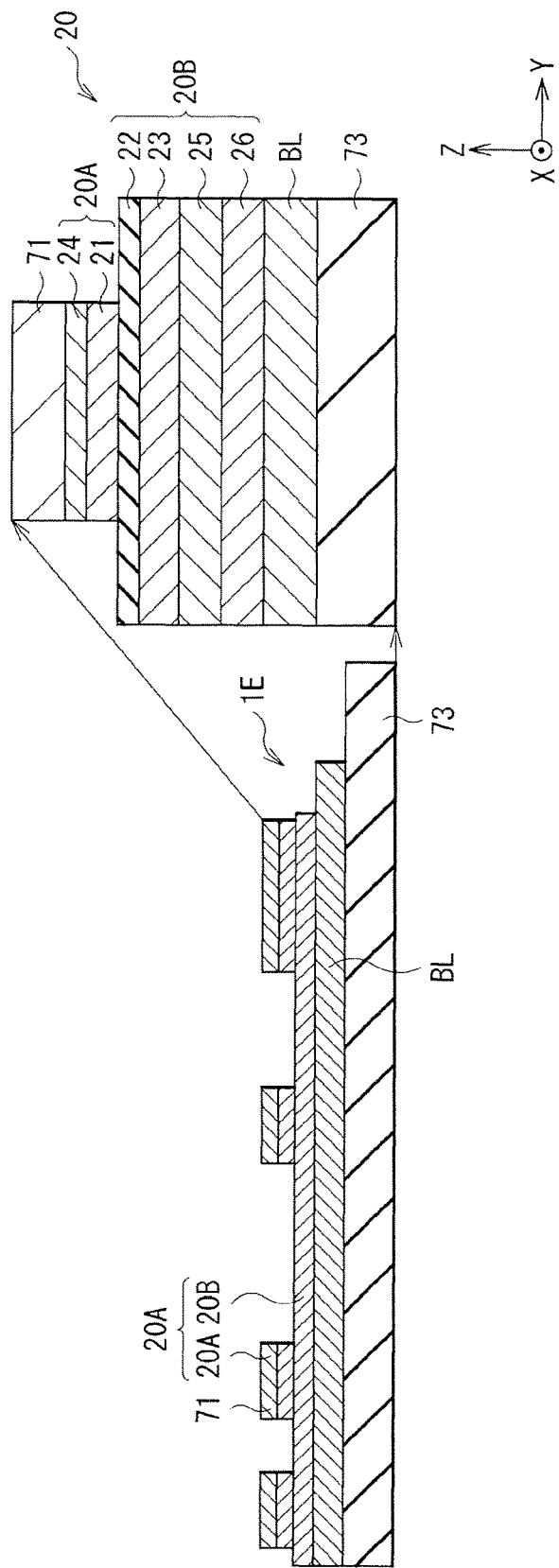
FIG. 24 is a sectional diagram illustrating a process following the processes in FIG. 23.

Then, the connection layer material film 71A and the resistance change device material film 29 are patterned by the RIE, the ion milling, or the like, to form the connection layer 71 and the plurality of resistance change devices 20 in the same way as in the second embodiment, as illustrated in FIG. 24. The discrete laminated section 20A that includes the record layer 21 and the cap layer 24 and the common laminated section 20B that includes the tunnel barrier layer 22, the reference layer 23, the antiferromagnetic layer 25, and the buffer layer 26 are provided for the plurality of resistance change devices 20. The discrete laminated section 20A and the connection layer 71 are respectively separated into parts for each of the plurality of resistance change devices 20. The common laminated section 20B is continuously provided across the plurality of resistance change devices 20.

Figure 25:
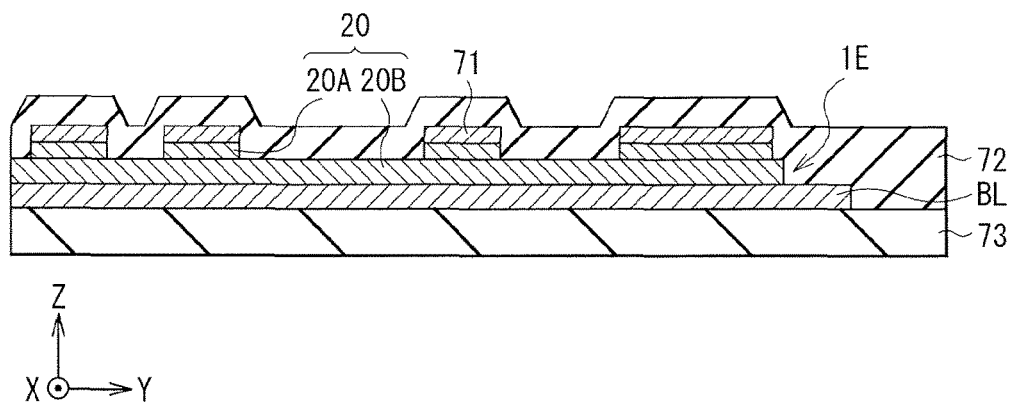
FIG. 25 is a sectional diagram illustrating a process following the process in FIG. 24.
Figure 26:
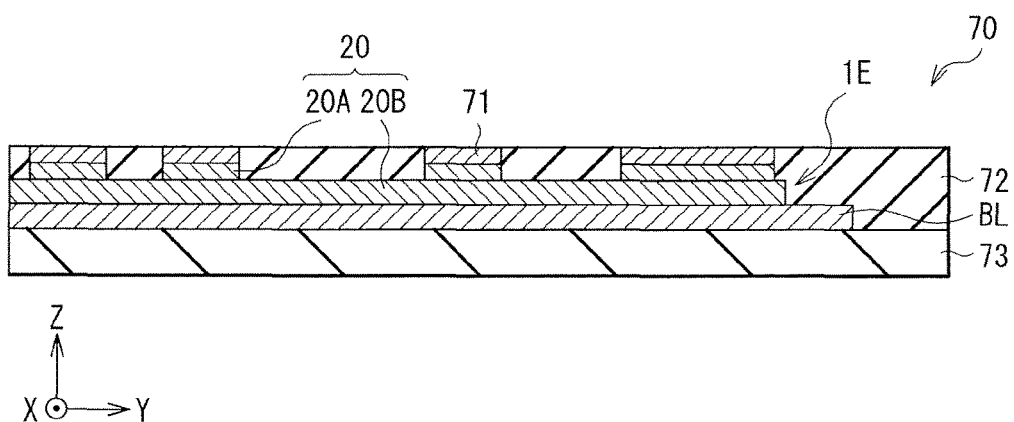
FIG. 26 is a sectional diagram illustrating a process following the process in FIG. 25.

Then, the protection film (the interlayer insulating film) 72 is formed so as to embed the connection layer 71, the resistance change device 20, and the bit line BL in the same way as in the second embodiment, as illustrated in FIG. 25. Thereafter, the protection film 72 is polished by the CMP to expose the connection layer 71 in the same way as in the second embodiment, as illustrated in FIG. 26. Thus, the second member 70 in which the bit line BL, the resistance change device 20, and the connection layer 71 are formed on the second substrate 73 is formed.

Then, the second member 70 may be bonded to the back surface 60B of the first member 60 by using, for example, the substrate bonding technique such as normal temperature bonding. The second substrate 73 may be either left or removed by etching and so forth. As a result of the above, formation of the semiconductor device 3 illustrated in FIG. 22 is completed.

Fourth Embodiment

Figure 27:
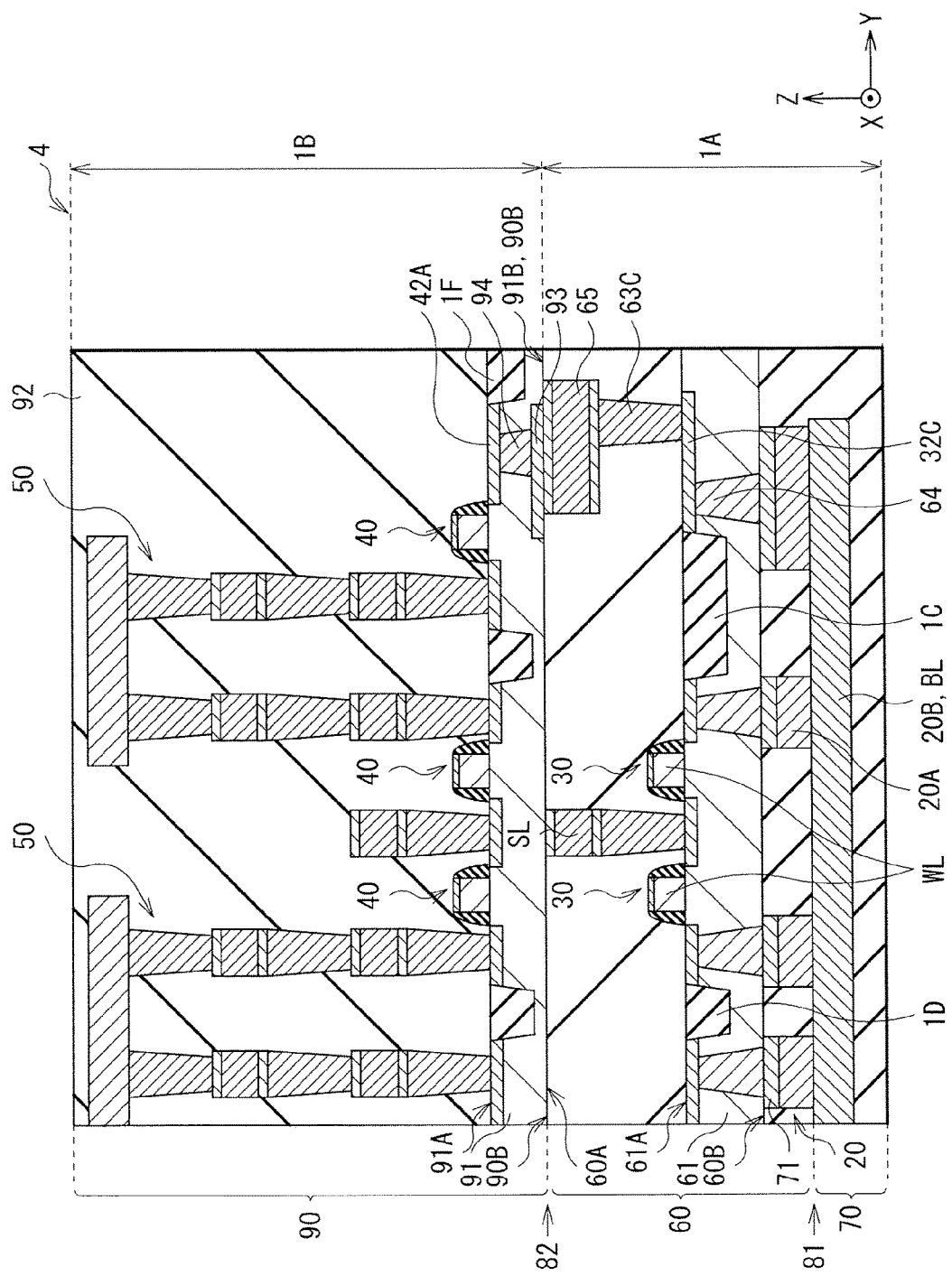
FIG. 27 is a sectional diagram illustrating a configuration of a semiconductor device according to a fourth embodiment of the present disclosure.

FIG. 27 is a diagram illustrating a sectional configuration of a semiconductor device 4 according to a fourth embodiment of the present disclosure. In the fourth embodiment, the memory device section 1A and the logic device section 1B are laminated in the lamination direction Z so as to further reduce the wiring resistance and to further improve the degree of integration. The semiconductor device 4 has the same configuration, function, and effects as the semiconductor device 1 according to the first embodiment except for the above-mentioned point. Therefore, description will be made by assigning the same numerals to the corresponding constitutional elements.

The memory device section 1A has the configuration in which the first member 60 and the second member 70 are bonded together along the bonding surface 81 in the same way as in the first embodiment. The first member 60, the second member 70, the resistance change device 20, and the selection transistor 30 are configured in the same way as in the first to third embodiments. FIG. 27 illustrates an example of a case that the first member 60, the second member 70, the resistance change device 20, and the selection transistor 30 are configured in the same way as in the first embodiment.

The logic device section 1B is provided in a third member 90 different from the first member 60 and the second member 70. A back surface 90B of the third member 90 is bonded to a front surface 60A of the first member 60 along a bonding surface 82.

The third member 90 includes the transistor 40 of the peripheral circuit on a front surface 91A side of a third substrate 91. The adjacent transistors 40 are separated by a device separation layer 1F. The multilayer wiring 50 is connected to the low resistance sections 42A and 42B of the transistor 40. The multilayer wiring 50 is disposed in an interlayer insulating film 92.

Further, the diffusion layer of the selection transistor 30 of the memory device section 1A and the diffusion layer of the transistor 40 of the logic device section 1B are connected together via a connection section 1G. The connection section 1G is disposed between the low resistance section 42A of the transistor 40 of the peripheral circuit and the bit line BL extended in the logic device section 1B. The connection section 1G may have a configuration in which, for example, the resistance change device 20, the connection layer 71, the back surface contact electrode 64, a low resistance section 32C, a front surface contact electrode 63C, a wiring layer 65, a low resistance section 93, a back surface contact electrode 94 are laminated in this order starting from a side close to the bit line BL. The low resistance section 32C is disposed on the same layer as the low resistance sections 32A and 32B of the selection transistor 30. The front surface contact electrode 63A and the wiring layer 65 are disposed on the same layer as the front surface contact electrode 63 and the source line SL. The low resistance section 93 is disposed on a back surface 91B of the third substrate 91. The back surface contact electrode 94 is disposed between the low resistance section 42A of the transistor 40 of the peripheral circuit and the low resistance section 93 so as to penetrate through the third substrate 91. It is to be noted that it is also possible to connect the back surface contact electrode 94 directly to the wiring layer 65 by omitting the low resistance section 93. However, provision of the low resistance section 93 makes it possible to select the material suitable for normal temperature bonding as the material of the low resistance section 93 and therefore it becomes possible to improve bonding strength.

It is possible to manufacture the semiconductor device 4 in the same way as the semiconductor device 1 of the first embodiment except that the logic device section 1B is formed in the third member 90 different from the first member 60 and the second member 70 and the back surface 90B of the third member 90 is bonded to the front surface 60A of the first member 60 along the bonding surface 82.

Fifth Embodiment

Figure 28:
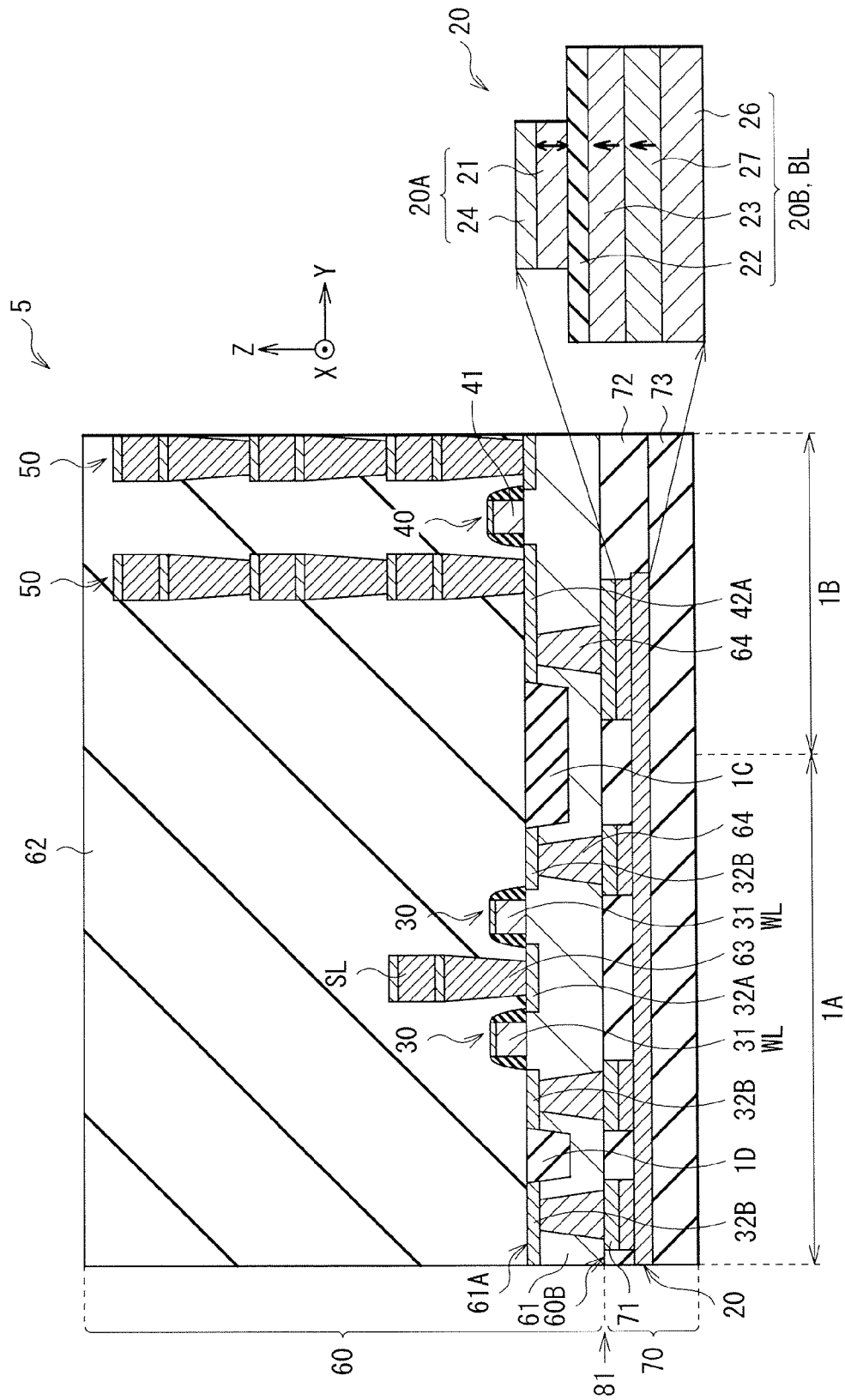
FIG. 28 is a sectional diagram illustrating a configuration of a semiconductor device according to a fifth embodiment of the present disclosure.

FIG. 28 is a diagram illustrating a sectional configuration of a semiconductor device 5 according to a fifth embodiment of the present disclosure. In the fifth embodiment, a perpendicular magnetization type STT-MTJ is included in the resistance change device 20. The record layer 21 and the reference layer 23 are each configured of a film, an axis of easy magnetization of which is directed in a vertical direction relative to a film surface. The semiconductor device 5 has the same configuration, function, and effects as the semiconductor device 1 of the above-mentioned first embodiment except for the above-mentioned point. Therefore, description will be made by assigning the same numerals to the corresponding constitutional elements.

The resistance change device 20 is a spin injection magnetization reversal type memory device that includes the cap layer 24, the record layer 21, the tunnel barrier layer 22, the reference layer 23, a perpendicular magnetization layer 27, and the buffer layer 26 in this order starting from a side close to the connection layer 71 as illustrated with the enlarged size in FIG. 28. In other words, the resistance change device 20 has the bottom pin structure that includes the reference layer 23, the tunnel barrier layer 22, and the record layer 21 in this order from bottom to top in the lamination direction Z, and the record layer 21 is connected to the drain of the selection transistor 30.

The perpendicular magnetization layer 27 may be a perpendicular magnetization film configured of, for example, a single layer of a CoPt-based alloy, TbFeCo, GdFeCo, FePt, or CoCrPt, a laminated layer of Co/Pt, or a laminated layer of Fe/Pt. The reference layer 23 may be configured of, for example, a single layer of CoFe, CoFeB, and so forth or a laminated fern-structure of CoFe/Ru/CoFeB and so forth. The tunnel barrier layer 22 may be configured of, for example, an oxide film such as AlO and MgO. The record layer 21 is configured of a single layer of CoFe, CoFeB, and so forth, a laminated structure in which a layer of Ru, MgO, and so forth is sandwiched between layers of CoFe, CoFeB, NiFe, and so forth, or a laminated structure configured of a layer of CoFe, CoFeB, and so forth and the perpendicular magnetization film.

Figure 29:
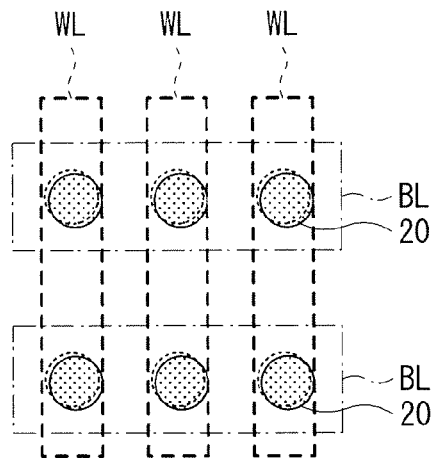
FIG. 29 is a plan view illustrating a configuration of a perpendicular magnetization type resistance change device illustrated in FIG. 28.
Figure 30:
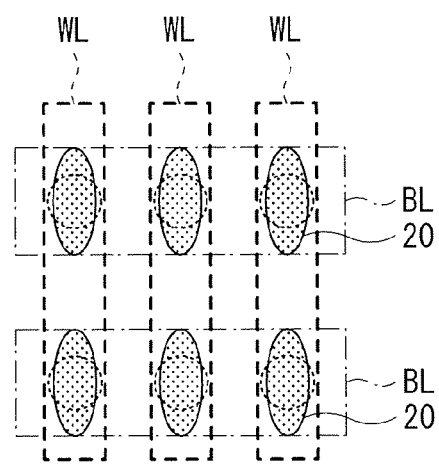
FIG. 30 is a plan view illustrating a configuration of an in-plane magnetization type resistance change device illustrated in FIG. 6.

When the resistance change device 20 is configured of the perpendicular magnetization type STT-MTJ, it is possible to make its shape small into a circular shape or a shape similar to the circular shape as illustrated in FIG. 29 unlike the in-plane magnetization type device, and further miniaturization of the resistance change device 20 becomes possible. It is to be noted that an example of the planar shape of the in-plane magnetization type device is illustrated in FIG. 30 for ready understanding.

The semiconductor device 5 may be manufactured, for example, in the following manner.

FIG. 31 to FIG. 39 are diagrams illustrating a method of manufacturing the semiconductor device 5 in order of processes. It is to be noted that with respect to the processes that are the same as those in the first embodiment, description will be made with reference to FIG. 10 to FIG. 13.

Figure 31:
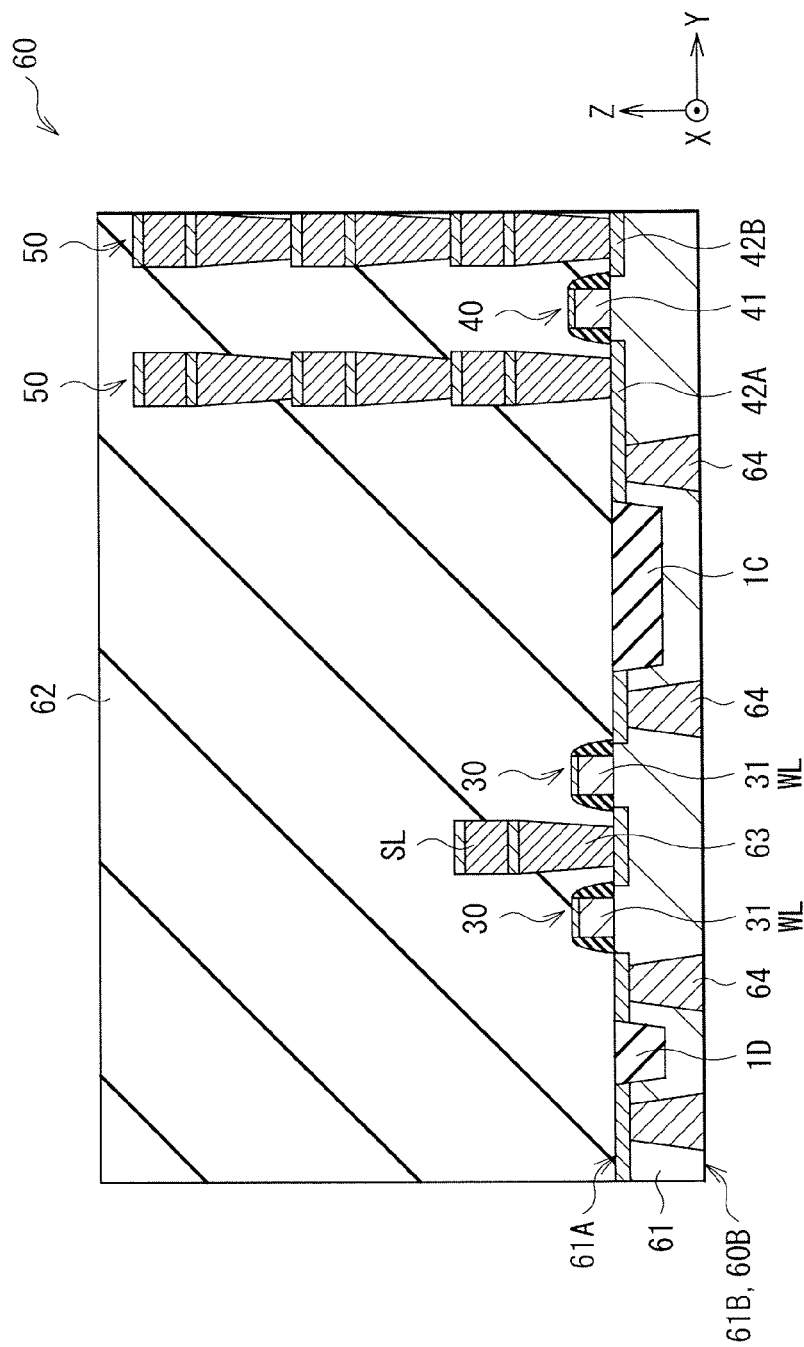
FIG. 31 is a sectional diagram illustrating a method of manufacturing the semiconductor device illustrated in FIG. 28 in order of processes.

First, the first member 60 is formed by the process illustrated in FIG. 10 in the same way as in the first embodiment, as illustrated in FIG. 31.

Figure 32:
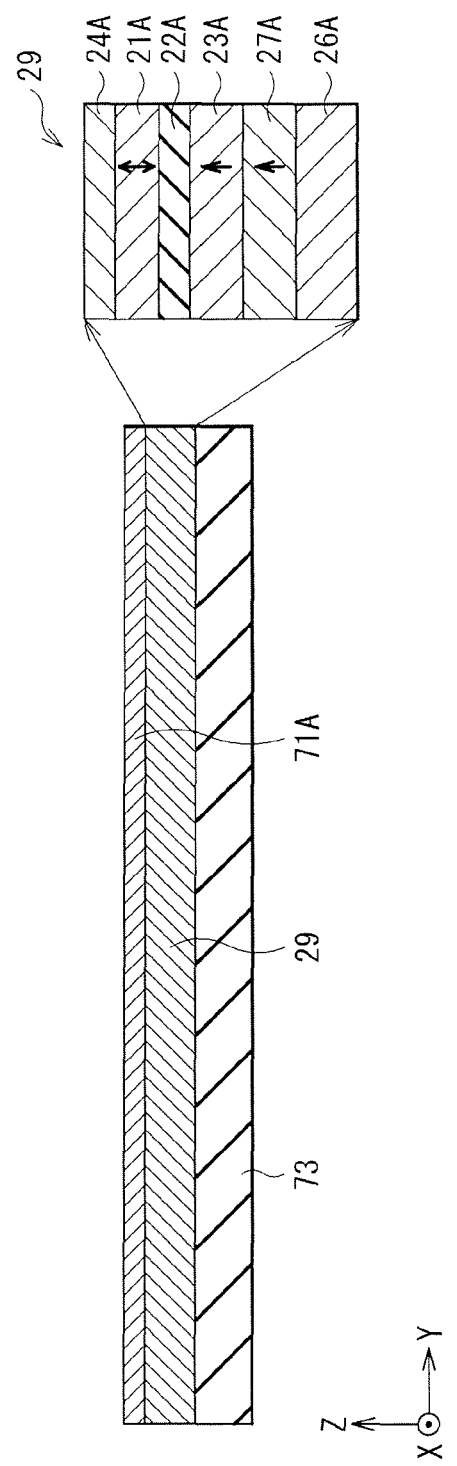
FIG. 32 is a sectional diagram illustrating a process following the processes in FIG. 31.

Then, the resistance change device material film 29 and the connection layer material film 71A are formed on the second substrate 73 by the process illustrated in FIG. 11 in the same way as in the first embodiment, as illustrated in FIG. 32. As the resistance change device material film 29, the buffer layer material film 26A, a perpendicular magnetization material film 27A, the reference layer material film 23A, the tunnel barrier layer material film 22A, the record layer material film 21A, and the cap layer material film 24A are formed in this order starting from the side close to the second substrate 73 as illustrated with the enlarged size in FIG. 32.

Figure 33:
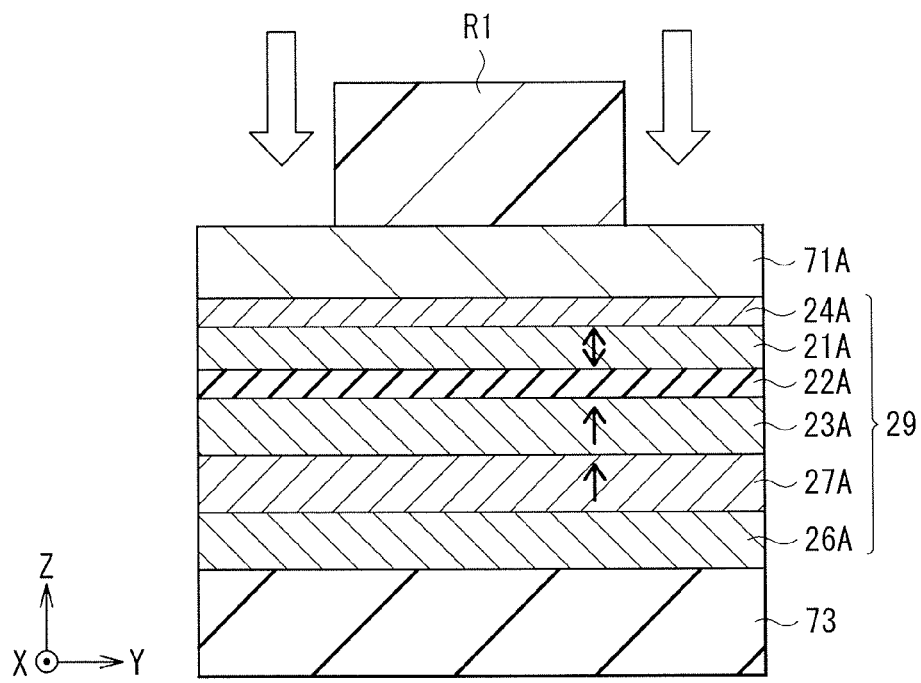
FIG. 33 is a sectional diagram illustrating a process following the processes in FIG. 32.
Figure 34:
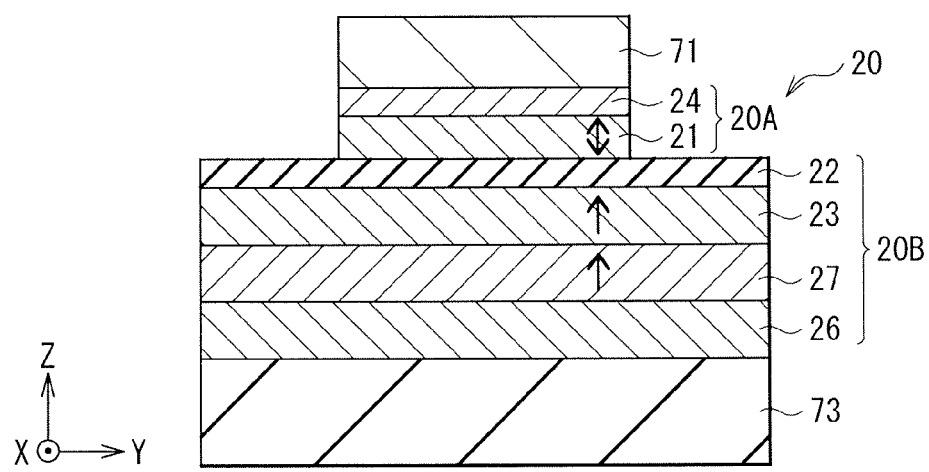
FIG. 34 is a sectional diagram illustrating a process following the process in FIG. 33.

Then, the resist R1 is formed on the connection layer material film 71A as illustrated in FIG. 33.

Thereafter, the connection layer material film 71A and the resistance change device material film 29 are patterned by the RIE, the ion milling, or the like by using the resist R1 as the mask to form the connection layer 71 and the plurality of resistance change devices 20.

In that case, the discrete laminated section 20A that includes the record layer 21 and the cap layer 24 and the common laminated section 20B that includes the tunnel barrier layer 22, the reference layer 23, the perpendicular magnetization layer 27, and the buffer layer 26 are provided for the plurality of resistance change devices 20. The discrete laminated section 20A and the connection layer 71 are respectively separated into parts for each of the plurality of resistance change devices 20. The plane of the discrete laminated section 20A is formed into the circular shape or the shape similar to the circular shape as illustrated in FIG. 29. The common laminated section 20B is continuously provided across the plurality of resistance change devices 20.

The damage to the tunnel barrier 22 upon etching is suppressed and degradation of insulation of the tunnel barrier layer 22 caused by re-deposition that would occur when etching the reference layer 23 and succeeding layers is suppressed by not processing the tunnel barrier layer 22 and processing the layers up to the record layer 21. Accordingly, it becomes possible to improve the insulation and reliability of the tunnel barrier layer 22.

Figure 35:
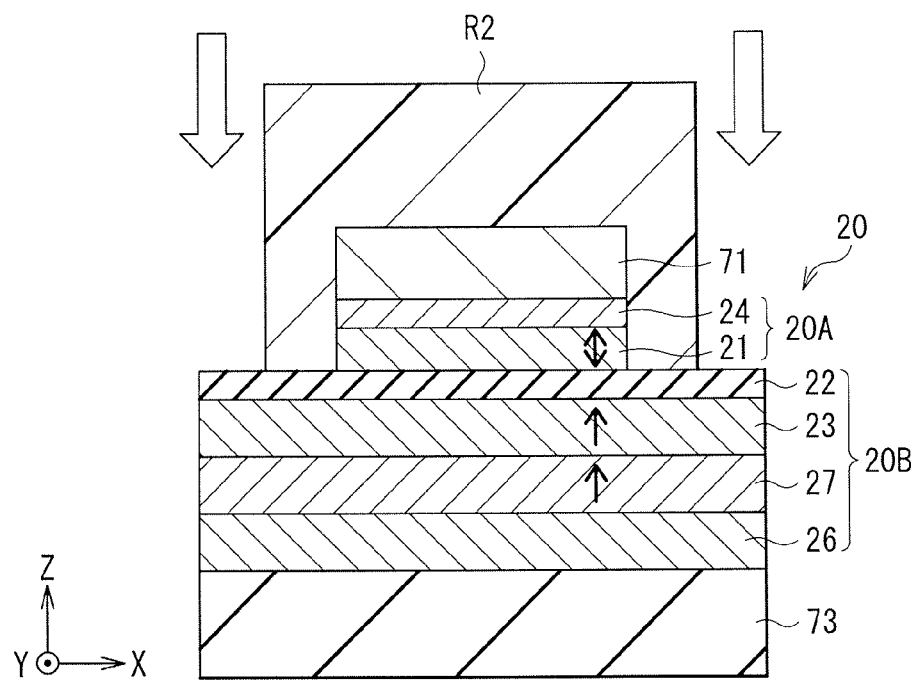
FIG. 35 is a sectional diagram illustrating a process following the process in FIG. 34.

Then, the resist R2 that covers the discrete laminated section 20A is formed as illustrated in FIG. 35.

Figure 36:
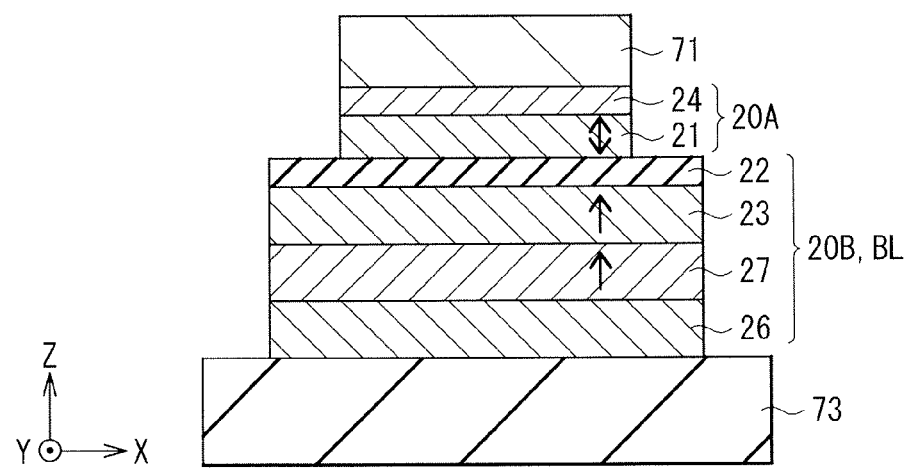
FIG. 36 is a sectional diagram illustrating a process following the process in FIG. 35.
Figure 37:
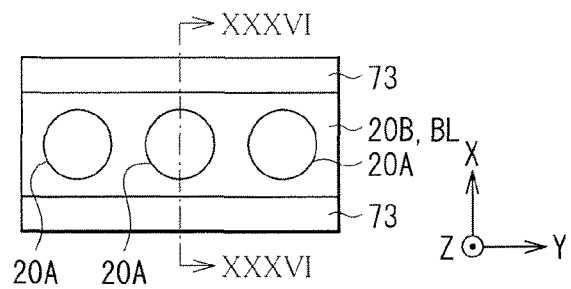
FIG. 37 is a top plan view illustrating the process illustrated in FIG. 36.

Then, the common laminated section 20B is patterned by the REI, the ion milling, or the like by using the resist R2 as the mask to form the bit line BL as illustrated in FIG. 36 and FIG. 37. Thus, the common laminated section 20B is made to also serve as the bit line BL.

Figure 38:
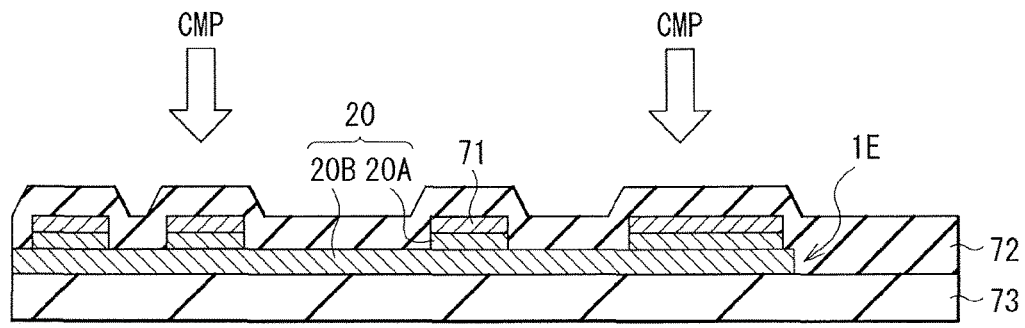
FIG. 38 is a sectional diagram illustrating a process following the process in FIG. 36.
Figure 39:
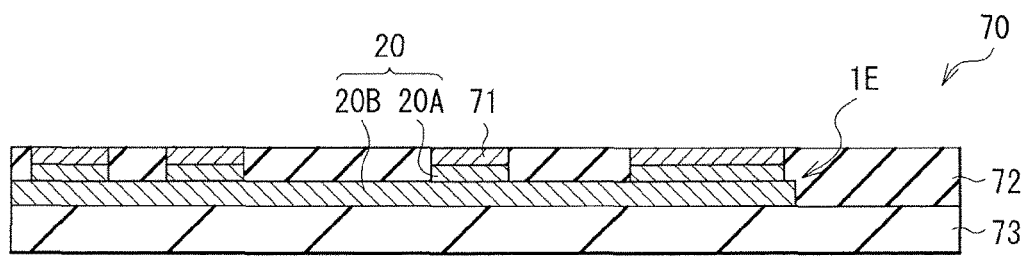
FIG. 39 is a sectional diagram illustrating a process following the process in FIG. 37.

Then, the protection film (the interlayer insulting film) 72 is formed so as to embed the connection layer 71 and the resistance change device 20 as illustrated in FIG. 38. Thereafter, the protection film 72 may be polished, for example, by the CMP to expose the connection layer 71 as illustrated in FIG. 39. Thus, the second member 70 in which the resistance change device 20 and the connection layer 71 are formed on the second substrate 73 is formed.

Then, the second member 70 may be bonded to the back surface 60B of the first member 60 by using, for example, the substrate bonding technique such as normal temperature bonding. The second substrate 73 may be either left or removed by etching and so forth. As a result of the above, formation of the semiconductor device 5 illustrated in FIG. 28 is completed.

Sixth Embodiment

Figure 40:
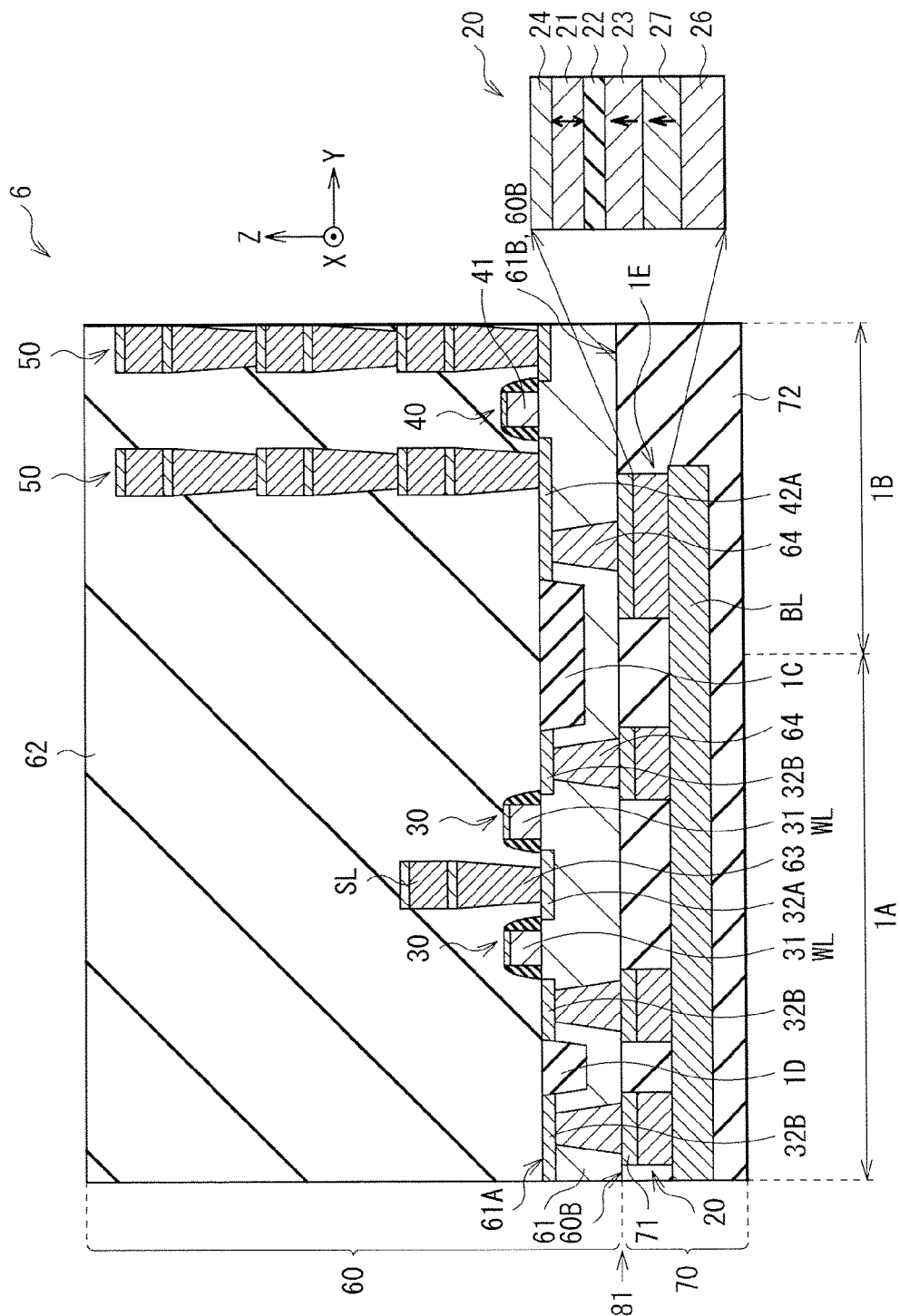
FIG. 40 is a sectional diagram illustrating a configuration of a semiconductor device according to a sixth embodiment of the present disclosure.

FIG. 40 is a diagram illustrating a sectional configuration of a semiconductor device 6 according to a sixth embodiment of the present disclosure. In the sixth embodiment, the bit line BL is provided separately from the common laminated section 20B of the resistance change device 20. The semiconductor device 6 has the same configuration, function, and effects as the semiconductor device 5 of the fifth embodiment except for the above-mentioned point. Therefore, description will be made by assigning the same numerals to the corresponding constitutional elements.

The semiconductor device 6 may be manufactured, for example, in the following manner.

FIG. 41 to FIG. 48 are diagrams illustrating a method of manufacturing the semiconductor device 6 in order of processes. It is to be noted that with respect to the processes that are the same as those in the fifth embodiment, description will be made with reference to FIG. 31.

First, the first member 60 is formed by the process illustrated in FIG. 31 in the same way as in the first and fifth embodiments.

Figure 41:
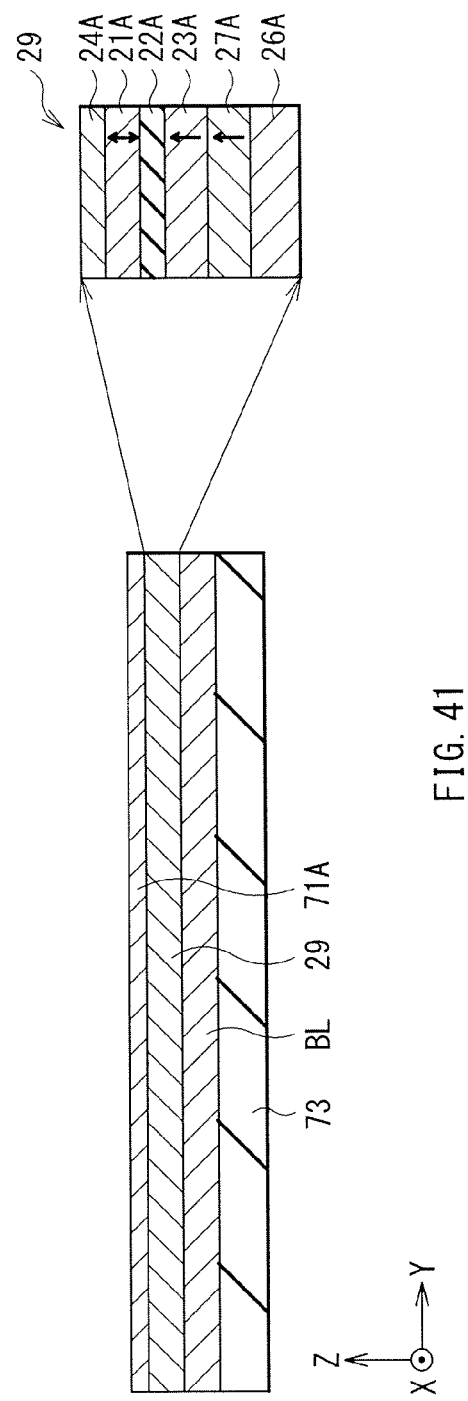
FIG. 41 is a sectional diagram illustrating a method of manufacturing the semiconductor device illustrated in FIG. 40 in order of processes.

Then, after the bit line BL is formed on the second substrate 73, the resistance change device material film 29 and the connection layer material film 71A are formed on the entire surface on which the bit line BL has been formed as illustrated in FIG. 41. As the resistance change device material film 29, the buffer layer material film 26A, the perpendicular magnetization layer material film 27A, the reference layer material film 23A, the tunnel barrier layer material film 22A, the record layer material film 21A, and the cap layer material film 24A are formed in this order starting from the side close to the second substrate 73 as illustrated with the enlarged size in FIG. 41.

Figure 42:
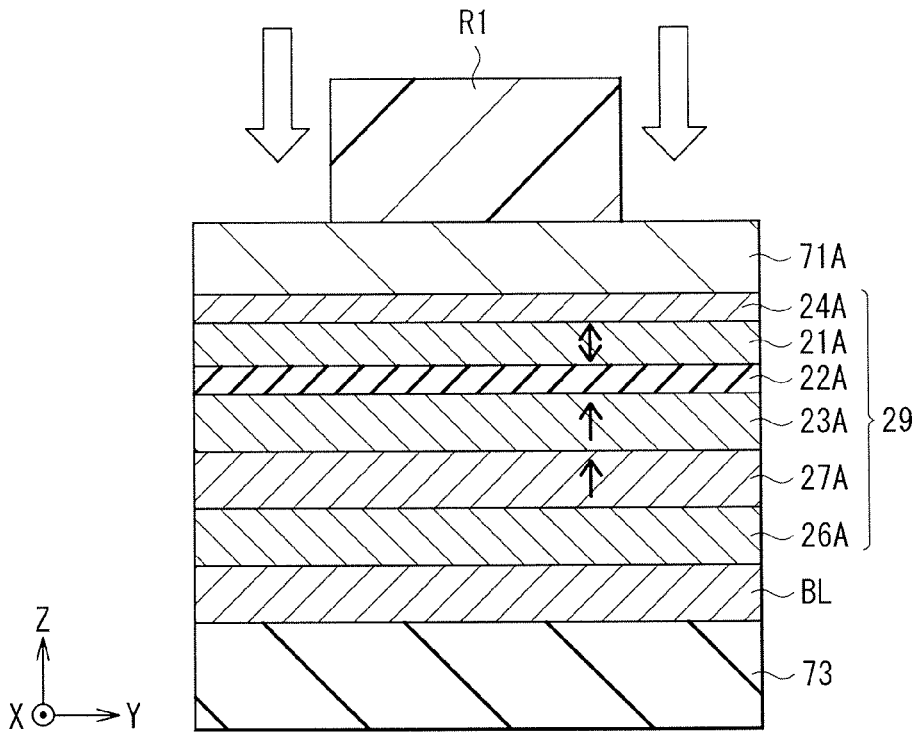
FIG. 42 is a sectional diagram illustrating a process following the processes in FIG. 41.
Figure 43:
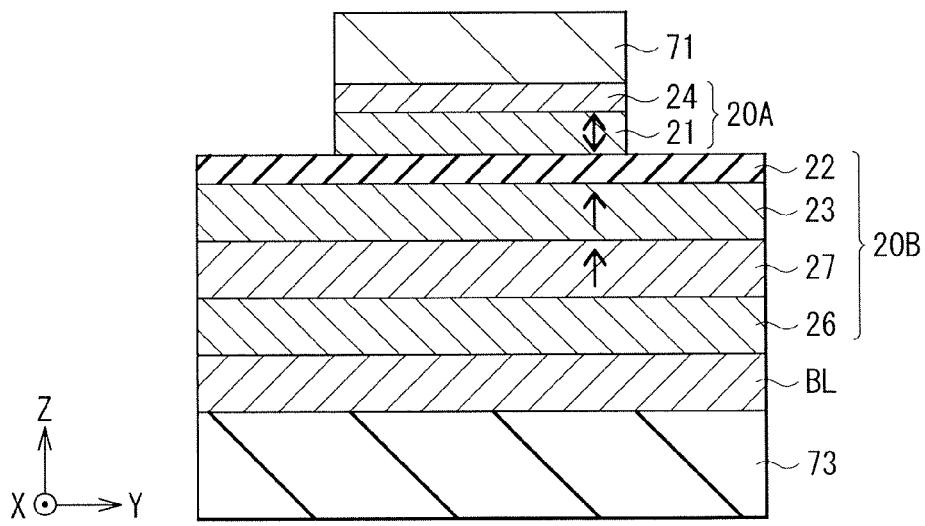
FIG. 43 is a sectional diagram illustrating a process following the process in FIG. 42.

Then, the resist R1 is formed on the connection layer material film 71A as illustrated in FIG. 42.

Thereafter, the connection layer material film 71A and the resistance change device material film 29 are patterned by the RIE, the ion milling, or the like by using the resist R1 as the mask, to form the connection layer 71 and the plurality of resistance change devices 20. The discrete laminated section 20A that includes the record layer 21 and the common laminated section 20B that includes the tunnel barrier layer 22 and the reference layer 23 are provided for the plurality of resistance change devices 20. The discrete laminated section 20A and the connection layer 71 are respectively separated into parts for each of the plurality of resistance change devices 20. The plane of the discrete laminated section 20A is formed into the circular shape or the shape similar to the circular shape as illustrated in FIG. 29. The common laminated section 20B is continuously provided across the plurality of resistance change devices 20.

Figure 44:
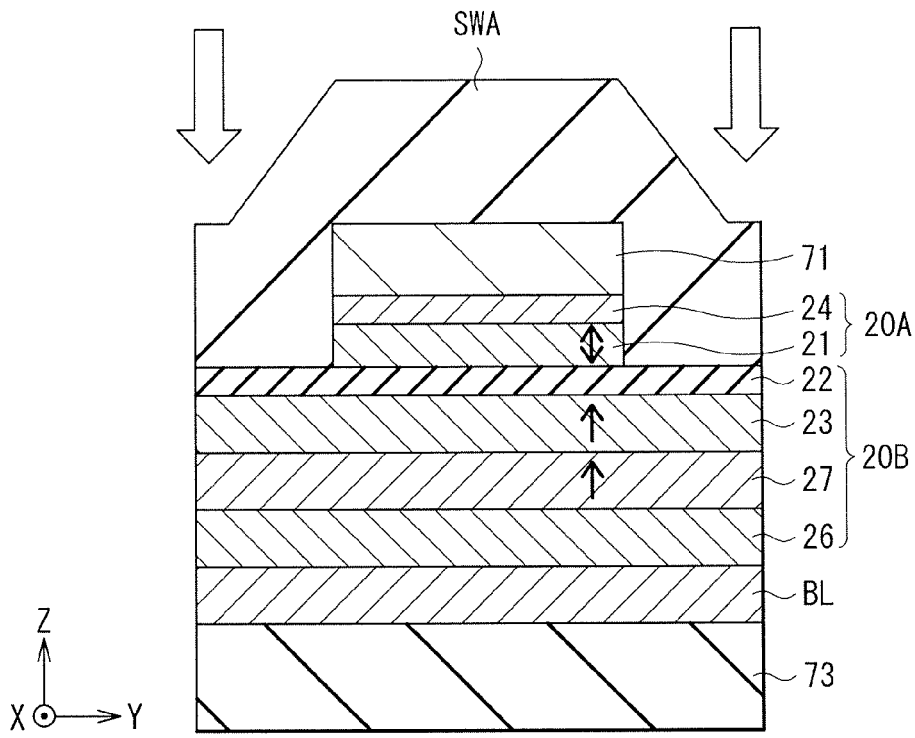
FIG. 44 is a sectional diagram illustrating a process following the process in FIG. 43.

Then, an insulating film SWA that covers the resistance change device 20 and the connection layer 71 is formed as illustrated in FIG. 44.

Figure 45:
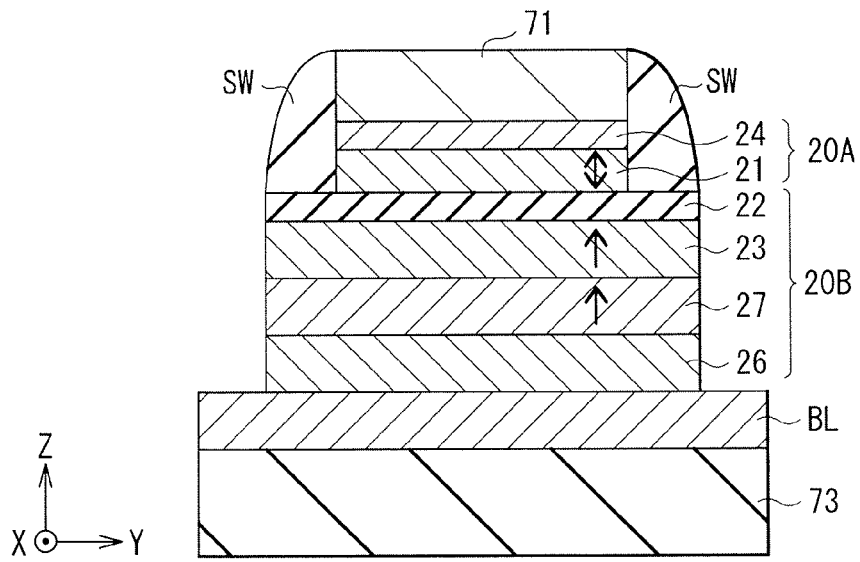
FIG. 45 is a sectional diagram illustrating a process following the process in FIG. 44.
Figure 46:
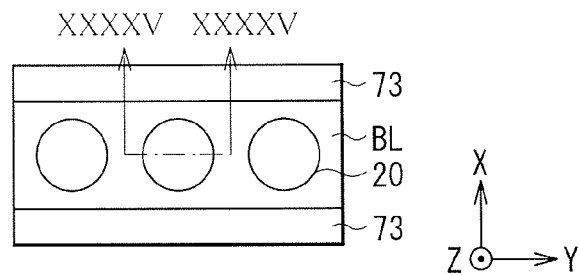
FIG. 46 is a top plan view illustrating the process illustrated in FIG. 45.

Then, etch-back is performed by the RIE and so forth by using the insulating film SWA as the mask to form a side wall SW on a side surface of the discrete laminated section 20A and to separate the common laminated section 20B into parts for each of the resistance change devices 20 as illustrated in FIG. 45 and FIG. 46. In the sixth embodiment, formation of the resistance change device 20 by self-alignment becomes possible by forming the side wall SW on the side surface of the discrete laminated section 20B, thereby attaining process reduction, improving alignment accuracy, and improving the reliability and degree of integration of the resistance change device 20.

Figure 47:
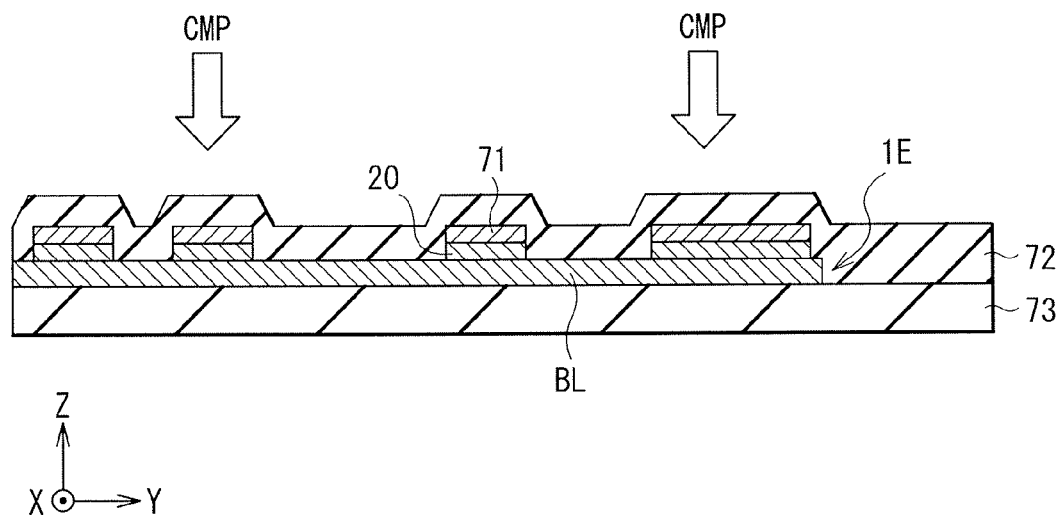
FIG. 47 is a sectional diagram illustrating a process following the process in FIG. 46.
Figure 48:
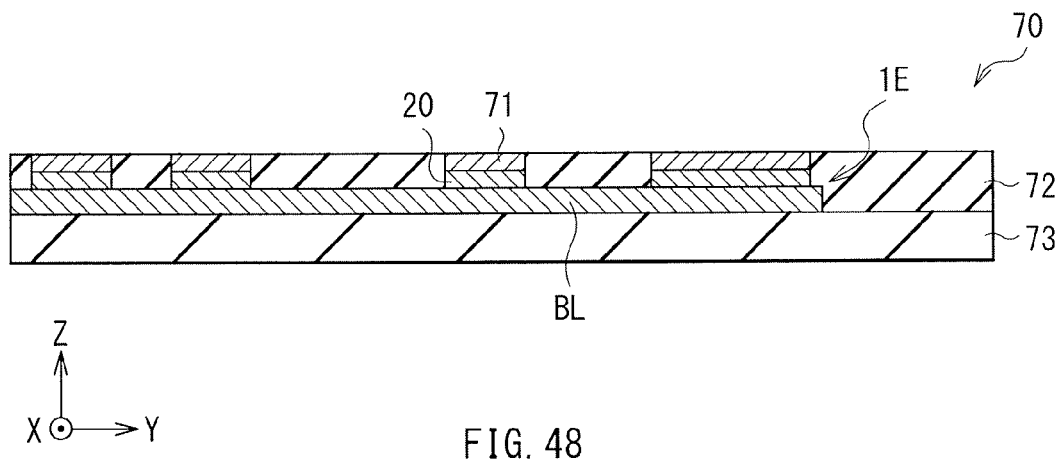
FIG. 48 is a sectional diagram illustrating a process following the process in FIG. 47.

Then, the protection film (the interlayer insulting film) 72 is formed so as to embed the connection layer 71 and the resistance change device 20 as illustrated in FIG. 47. Thereafter, the protection film 72 may be polished by, for example, the CMP to expose the connection layer 71 as illustrated in FIG. 48. Thus, the second member 70 in which the resistance change device 20 and the connection layer 71 are formed on the second substrate 73 is formed.

Then, the second member 70 may be bonded to the back surface 60B of the first member 60 by using, for example, the substrate bonding technique such as normal temperature bonding. The second substrate 73 may be either left or removed by etching and so forth. As a result of the above, formation of the semiconductor device 6 illustrated in FIG. 40 is completed.

It is to be noted that the manufacturing method of the sixth embodiment is not limitedly applied to the perpendicular magnetization type device described in the fifth embodiment. This manufacturing method may be also applied to a case where the bit line BL is provided separately from the common laminated section 20B of the in-plane magnetization type resistance change device 20, for example, as described in the third embodiment.

Seventh Embodiment

Figure 49:
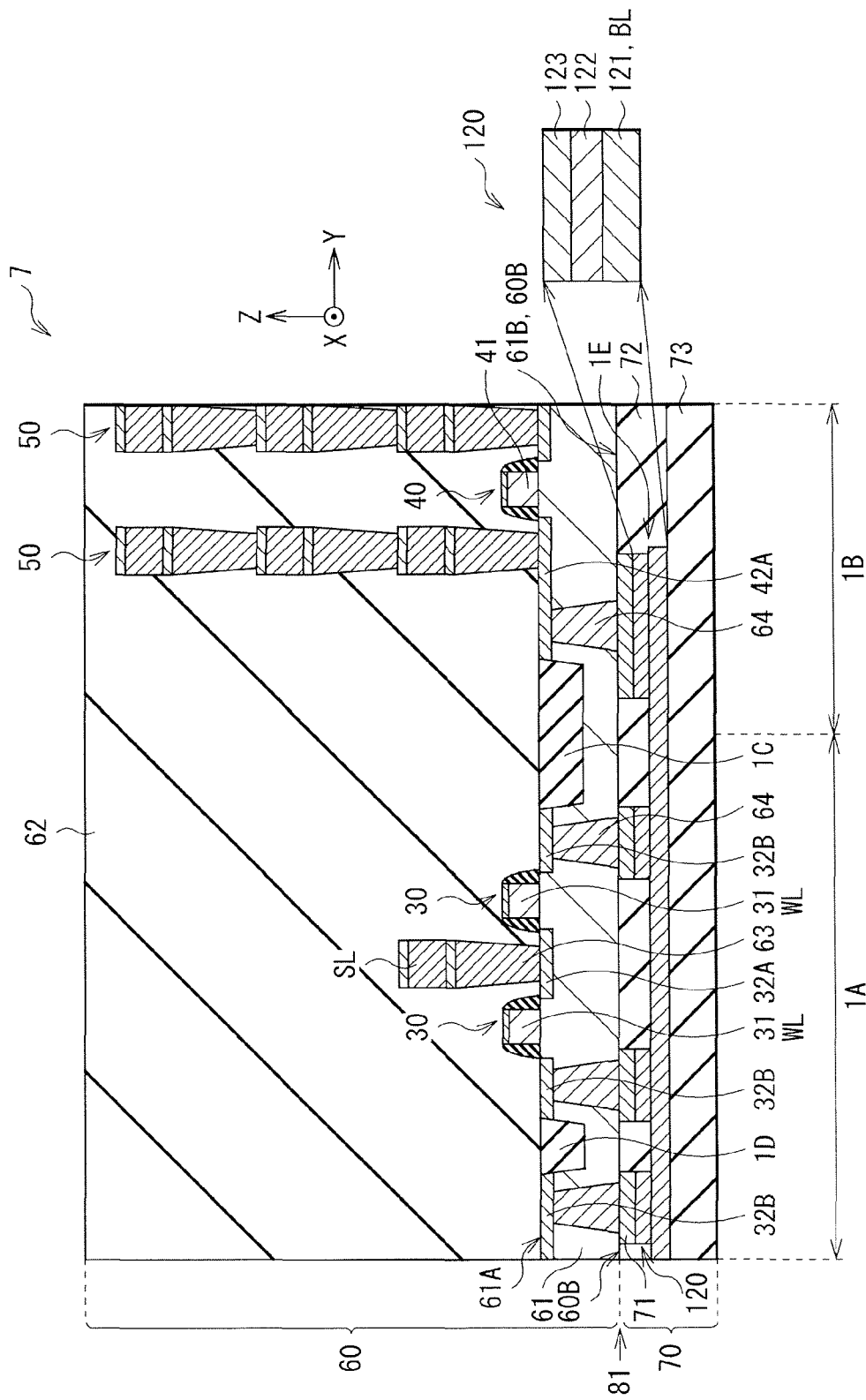
FIG. 49 is a sectional diagram illustrating a semiconductor device according to a seventh embodiment of the present disclosure.

FIG. 49 is a diagram illustrating a sectional configuration of a semiconductor device 7 according to a seventh embodiment of the present disclosure. In the seventh embodiment, the ReRAM is included as a resistance change device 120. The semiconductor device 7 has the same configuration, function, and effects as the semiconductor device 1 of the first embodiment except for the above-mentioned point and it is possible to manufacture the semiconductor device 7 in the same way as the semiconductor device 1 of the first embodiment. Therefore, description will be made by assigning the same numerals to the corresponding constitutional elements.

The resistance change device 120 is configured of a laminated film that includes a first electrode 121, a resistance change layer 122 made of an oxygen deficient type oxide of transition metal, and a second electrode 123. The first electrode 121 also serves as the bit line BL. The second electrode 123 is disposed in contact with the connection layer 71 and is connected to the selection transistor 30 via the connection layer 71. The resistance change layer 122 is disposed between the first electrode 121 and the second electrode 123.

The resistance change layer 122 is configured of a single layer film of the oxygen deficient type oxide film made of transition metals such as oxygen deficient type tantalum oxides and hafnium oxides or a laminated film formed of a combination of the above-mentioned films.

Examples of the constitutional materials of the first electrode 121 and the second electrode 123 may include Pt, Ir, Pd, Ag, and Cu as the electrode materials that are liable to induce resistance change. On the other hand, examples of the constitutional materials of the first electrode 121 and the second electrode 123 may include metals such as W, Ni, Ta, Ti, and Al and metal nitride films of TaN and so forth as the electrode materials that have difficulty in inducing the resistance change.

There exists a desirable combination of the above-mentioned electrode materials depending on the type of the selection transistor 30 to which the resistance change layer 122 is to be connected. For example, when an NMOS transistor is to be used, the material of the second electrode 123 may be selected from electrode materials with which the second electrode 123 has difficulty in inducing the resistance change and the material of the first electrode 121 may be selected from electrode materials with which the first electrode 121 is liable to induce the resistance change. On the other hand, when a PMOS transistor is to be used, the material of the second electrode 123 is selected from the electrode materials with which the second electrode 123 is liable to induce the resistance change and the material of the first electrode 121 is selected from the electrode materials with which the first electrode 121 has difficulty in inducing the resistance change.

A buffer layer (not illustrated) may be disposed between the first electrode 121 and the second substrate 73. In the above-mentioned case, the buffer layer is configured of a single layer or a laminated film of Cu, Ti, W, TiN, and so forth.

In the semiconductor device 7, when a voltage is applied from a not illustrated power source (a pulse application section) via the first electrode 121 and the second electrode 123, the resistance change layer 122 is changed from a high-resistance state to a low-resistance state (or from the low-resistance state to the high-resistance state). It becomes possible to repeatedly perform information writing into the resistance change device 120 and deletion of the information written into the resistance change device 120 by repeatedly performing such a process.

Eighth Embodiment

Figure 50:
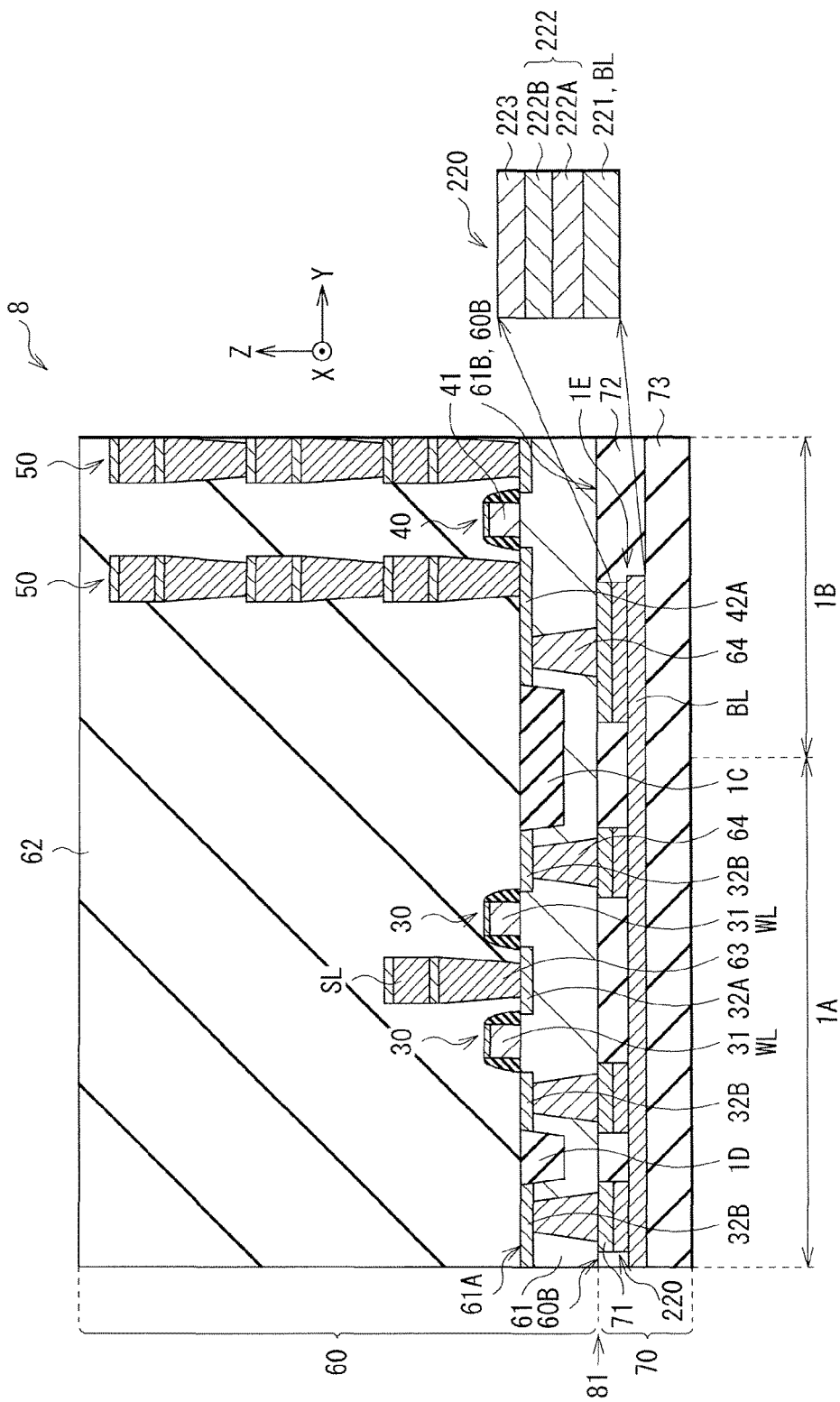
FIG. 50 is a sectional diagram illustrating a semiconductor device according to an eighth embodiment of the present disclosure.

FIG. 50 is a diagram illustrating a sectional configuration of a semiconductor device 8 according to an eighth embodiment of the present disclosure. In the eighth embodiment, a laminated structure of an ion source layer and a resistance change layer is included as a resistance change device 220. The semiconductor device 8 has the same configuration, function and effect as the semiconductor device 1 of the above-mentioned first embodiment except for the above-mentioned point, and it is possible to manufacture the semiconductor device 8 in the same way as the semiconductor device 1 of the first embodiment. Therefore, description will be made by assigning the same numerals to the corresponding constitutional elements.

The resistance change device 220 is configured of a laminated film that includes a first electrode 221, a memory layer 222, and a second electrode 223 as illustrated with the enlarged size in FIG. 50. The memory layer 222 includes an ion source layer 222A and a resistance change layer 222B in this order starting from a side close to the first electrode 221.

The first electrode 221 and the second electrode 223 are made of Pt, W, WN, Cu, and so forth.

The resistance change layer 222B is made of a metal oxide. Examples of the metal oxides include tantalum oxides, niobium oxides, aluminum oxides, nickel oxides, cobalt oxides, titanium oxides, hafnium oxides, zirconium oxides, gadolinium oxides and so forth or mixed materials of the above-mentioned oxides.

The ion source layer 222A may contain one or more of Cu, Ag, and Zn as ionizable metal elements, and one or more of chalcogenide elements of Te, Se, and S. Examples of the ion source layer 222A may include CuTe, GeSbTe, CuGeTe, AgGeTe, AgTe, ZnTe, ZnGeTe, CuS, CuGeS, CuSe, CuGeSe, and so forth. Further, B or rare-metal elements or Si may be contained. In addition, the order of laminating the ion source layer 222A and the resistance change layer 222B may be reversed.

A buffer layer (not illustrated) may be disposed between the first electrode 221 and the second substrate 73. In that case, the buffer layer is configured of a single layer or a laminated film of Cu, Ti, W, TiN, and so forth.

In the semiconductor device 8, when a voltage pulse or a current pulse is applied from the not illustrated power source (the pulse application section) via the first electrode 221 and the second electrode 223, electric characteristics, for example, a resistance value of the resistance change layer 222B may be changed, and thus information writing, deletion, and reading-out may be performed.

Modification Example 1

Figure 51:
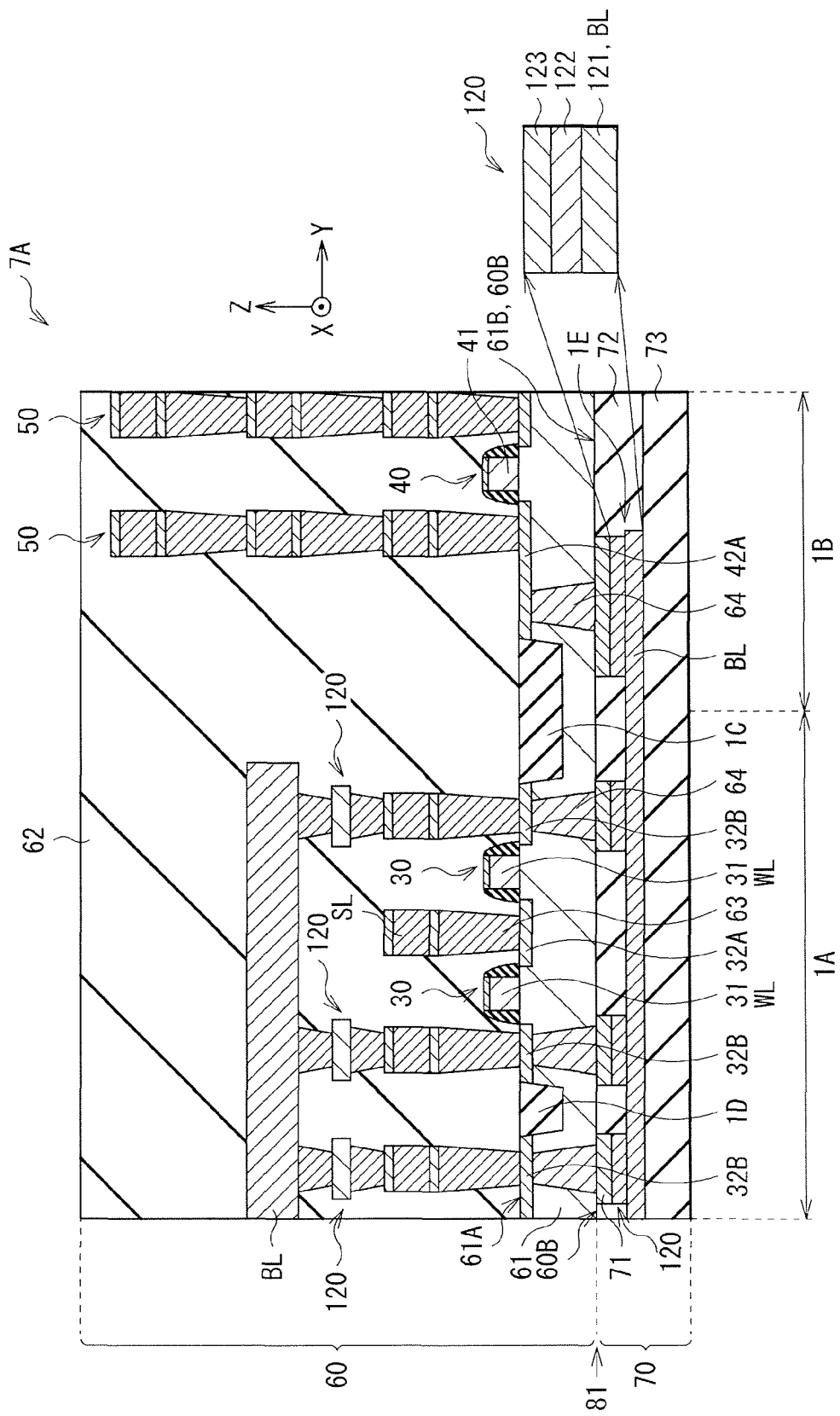
FIG. 51 is a sectional diagram illustrating a configuration of a semiconductor device according to a modification example 1.

FIG. 51 is a diagram illustrating an example of a sectional configuration of a semiconductor device 7A according to a modification example 1. The present modification example relates to the seventh embodiment that includes the resistance change device 120 configured of the ReRAM or the eighth embodiment that includes the resistance change device 220 having the laminated film of the ion source layer 222A and the resistance change layer 222B. In the semiconductor device 7A, the resistance change device 120 (or the resistance change device 220) is disposed in both of the second member 70 and the first member 60 so as to share the selection transistor 30 between these members in order to improve the degree of integration.

Modification Example 2

Figure 52:
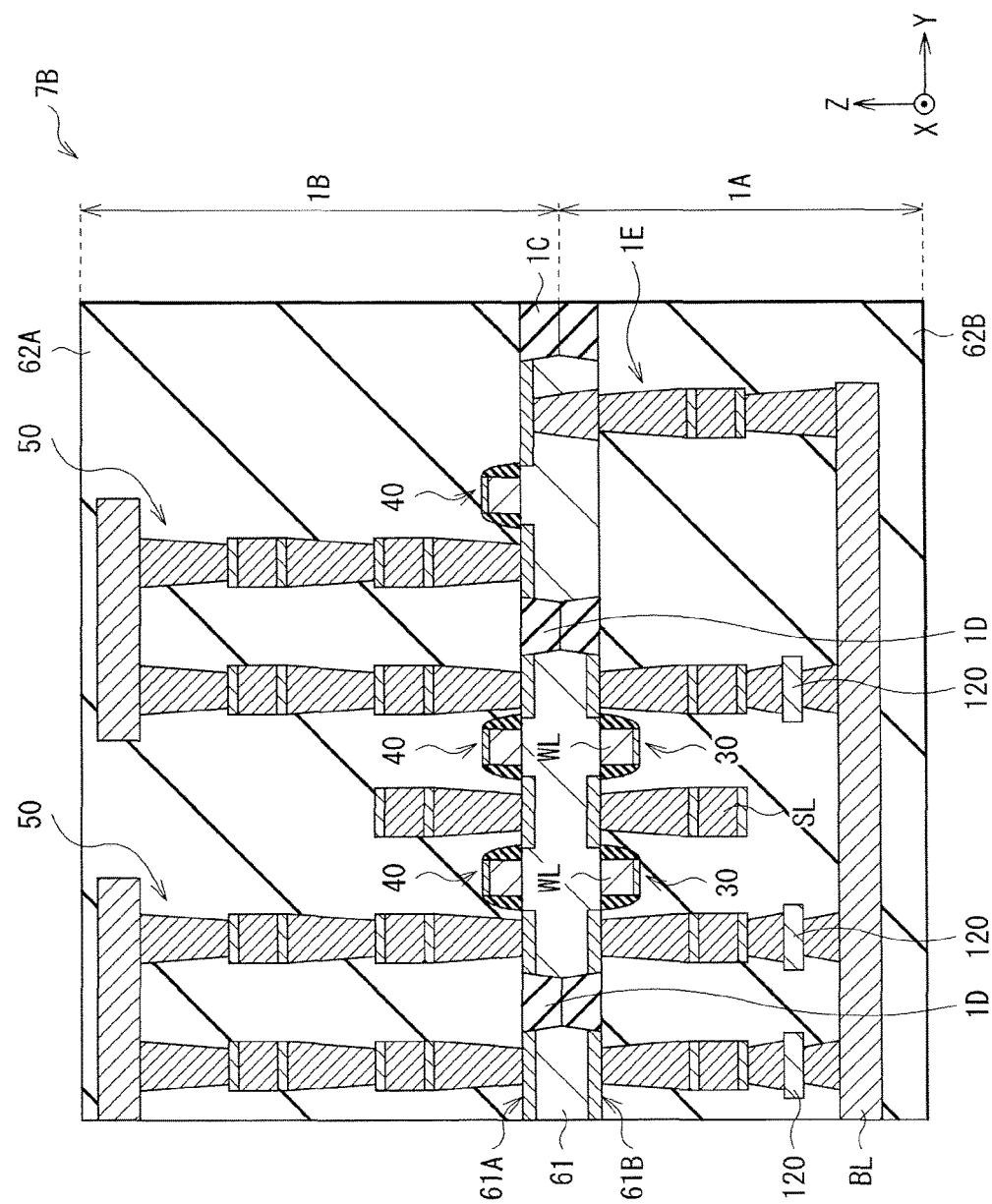
FIG. 52 is a sectional diagram illustrating a configuration of a semiconductor device according to a modification example 2.

It is to be noted that it is also possible to arrange the logic device section 1B on the front surface 61A side of the first substrate 61 and the memory device section 1A that includes the selection transistor 30 and the resistance change device 120 on the back surface 61B side of the first substrate 61 as with a semiconductor device 7B illustrated in FIG. 52. Also in the above-mentioned case, it becomes possible to improve the degree of integration. It is to be noted that an interlayer insulating film 62A is disposed on the front surface 61A side of the first substrate 61 and an interlayer insulating film 62B is disposed on the back surface 61B side of the first substrate 61.

The semiconductor device 7B of the present modification example may be formed by utilizing the front surface 61A side and the back surface 61B side of one first substrate 61 as illustrated in FIG. 52 or may be produced by substrate bonding in the same way as the semiconductor device 4 of the fourth embodiment (see FIG. 27). In that case, the bonding surface 82 serves as a surface along which the substrate provided with the transistor 30 and the substrate provided with the transistor 40 are bonded together.

Although the present disclosure has been described by giving the above-mentioned embodiments, the present disclosure is not limited to the above-mentioned embodiments and may be modified in a variety of ways.

For example, in the above-mentioned embodiments, description has been made on the semiconductor devices that respectively include the resistance change device 20 configured of the in-plane magnetization type or perpendicular magnetization type STT-MTJ, the resistance change device 120 configured of the ReRAM, and the resistance change device 220 having the laminated structure of the ion source layer 222A and the resistance change layer 222B. However, there is no particular limitation on the configuration of the resistance change device as long as it is the memory device that includes two terminals (electrodes) and stores information in response to a change in resistance state and the resistance change device may have another configuration.

In addition, although description has been made, for example, by specifically giving the configurations of the resistance change device 20 and the selection transistor 30 in the above-mentioned embodiments, it may not necessary to include all of the constitutional elements and other constitutional elements may be further included.

Further, for example, there may be no limitations on the material, thickness and forming method of each of the constitutional elements described in the above-mentioned embodiments, and each constitutional element may be made of another material, may have another thickness, and may be formed by another forming method.

It is to be noted that the technology may be configured as follows.

(1) A semiconductor device, including:
a first member including a selection transistor on a front surface side of a first substrate; and
a second member including a resistance change device and a connection layer that comes in contact with the resistance change device, the connection layer being bonded to a back surface of the first member.

(2) The semiconductor device according to (1), wherein the resistance change device is a spin injection magnetization reversal type memory device that includes a record layer, a tunnel barrier layer, and a reference layer in this order starting from a side close to the connection layer.

(3) The semiconductor device according to (2), wherein the second member includes a plurality of the resistance change devices, and
the plurality of resistance change devices include
a discrete laminated section that includes the record layer and is separated into parts for each of the plurality of resistance change devices, and
a common laminated section that includes the tunnel barrier layer and the reference layer, and is common to the plurality of resistance change devices.

(4) The semiconductor device according to (3), wherein the common laminated section also serves as a wiring that is common to the plurality of resistance change devices.

(5) The semiconductor device according to (3) or (4), wherein
the connection layer is separated into parts for each of the plurality of resistance change devices together with the discrete laminated section.

(6) The semiconductor device according to any one of (2) to (5), wherein
the record layer and the reference layer are each configured of a film, an axis of easy magnetization of which is directed in a vertical direction relative to a film surface.

(7) The semiconductor device according to any one of (1) to (6), wherein the first member includes a back surface contact electrode between the selection transistor and the connection layer, the back surface contact electrode penetrating through the first substrate.

(8) The semiconductor device according to any one of (1) to (7), further including:
a transistor of a peripheral circuit, wherein
the transistor of the peripheral circuit is disposed on a front surface side of the first substrate in the first member.

(9) The semiconductor device according to any one of (1) to (7), further including:
a third member including a transistor of a peripheral circuit on a front surface aside of a third substrate, wherein
a back surface of the third member is bonded to a front surface of the first member.

(10) A method of manufacturing a semiconductor device, including:
forming a second member that includes a resistance change device and a connection layer that comes in contact with the resistance change device; and
bonding the connection layer to a back surface of a first member that includes a selection transistor on a front surface side of a first substrate.

(11) The method according to (10), wherein
in forming the second member, a spin injection magnetization reversal type memory device is formed as the resistance change device, the spin injection magnetization reversal type memory device including a record layer, a tunnel barrier layer, and a reference layer in this order starting from a side close to the connection layer.

(12) The method according to (11), wherein
in forming the second member, a plurality of the resistance change devices are formed, and
as the plurality of resistance change devices,
a discrete laminated section and a common laminated section are formed,
the discrete laminated section including the record layer and being separated into parts for each of the plurality of resistance change devices, and
the common laminated section including the tunnel barrier layer and the reference layer and being common to the plurality of resistance change devices.

(13) The method according to (12), wherein
the common laminated section is made to also serve as a wiring that is common among the plurality of the resistance change devices.

(14) The method according to (13), wherein
the connection layer is formed by separating into parts for each of the plurality of resistance change devices together with the discrete laminated section.

(15) The method according to any one of (11) to (14), wherein
the record layer and the reference layer are each configured of a film, an axis of easy magnetization of which is directed in a vertical direction relative to film surfaces.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
a first member including a selection transistor on a front surface side of a first substrate; and
a second member including a plurality of resistance change devices and a connection layer which is in contact with the resistance change devices, the connection layer being bonded to the first member, the resistance change devices and the connection layer being embedded in a protection film layer,
wherein,
each resistance change device is a spin injection magnetization reversal type memory device that includes a record layer, a tunnel barrier layer, and a reference layer in this order proceeding from the connection layer, and
the plurality of resistance change devices includes (a) a discrete laminated section that includes a record layer film which is patterned into the separate record layers, and (b) a common laminated section that includes the tunnel barrier layer and the reference layer in common to all the plurality of resistance change devices.

2. The semiconductor device according to claim 1, wherein the common laminated section also serves as a wiring that is common to the plurality of resistance change devices.

3. The semiconductor device according to claim 1, wherein the connection layer is identically patterned with the record layer film into separated connection parts with a respective connection part for each of the plurality of resistance change devices.

4. The semiconductor device according to claim 1, wherein, for each resistance change device, the record layer and the reference layer are each configured of a film, an axis of easy magnetization of which is directed in a vertical direction relative to a film surface.

5. The semiconductor device of claim 1, wherein, each record layer has in-plane magnetization.

6. The semiconductor device of claim 1, wherein, in plan view, each record layer is patterned into an elliptical shape with an aspect ratio of 1.5 to 2.5, both inclusive.

7. A semiconductor device, comprising:
a first member including a selection transistor on a front surface side of a substrate; and
a second member including (a) a plurality of resistance change devices, (b) a connection layer which is in contact with the resistance change devices, and (c) a protection film in which the resistance change devices and the connection layer are embedded, the connection layer being bonded to the first member,
wherein,
the each resistance change device is a spin injection magnetization reversal type memory device that includes a record layer, a tunnel barrier layer, a reference layer, and an antiferromagnetic layer, in this order proceeding from the connection layer,
the plurality of resistance change devices includes (a) a discrete laminated section that is patterned into the separate record layers, and (b) a common laminated section that includes the tunnel barrier layer, the reference layer, and the antiferromagnetic layer in common to all of the resistance change devices,
the connection layer is patterned into respective separate connection parts for resistance change devices, the connection layer and the record layer being identically patterned.

8. A semiconductor device, comprising:
a first member including a selection transistor on a front surface side of a substrate; and
a second member including (a) a plurality of resistance change devices, (b) a connection layer which is in contact with the resistance change devices, and (c) a protection film in which the resistance change devices and the connection layer are embedded, the connection layer being bonded to the first member, wherein, the each resistance change device is a spin injection magnetization reversal type memory device that includes a cap layer, a record layer, a tunnel barrier layer, a reference layer, an antiferromagnetic layer, and a buffer layer, in this order proceeding from the connection layer, the plurality of resistance change devices includes (a) a discrete laminated section that is patterned into respective separate cap layers and record layers, and (b) a common laminated section that includes the tunnel barrier layer, the reference layer, the antiferromagnetic layer, and the buffer layer in common to all of the resistance change devices, the connection layer is patterned into respective separate connection parts for the resistance change devices, the connection layer, the cap layer, and the record layer being identically patterned.

* * * * *